(12) United States Patent
Nakashima et al.

(10) Patent No.: US 7,640,885 B2
(45) Date of Patent: Jan. 5, 2010

(54) LIQUID PROCESSING METHOD AND LIQUID PROCESSING APPARATUS

(75) Inventors: Tsunenaga Nakashima, Koshi-Machi (JP); Kenji Urata, Koshi-Machi (JP); Shinji Okada, Koshi-Machi (JP); Nobuaki Matsuoka, Koshi-Machi (JP)

(73) Assignee: Tokyo Electron Limited, Tokyo (JP)

( * ) Notice: Subject to any disclaimer, the term of this patent is extended or adjusted under 35 U.S.C. 154(b) by 207 days.

(21) Appl. No.: 11/812,766

(22) Filed: Jun. 21, 2007

(65) Prior Publication Data

US 2007/0245953 A1   Oct. 25, 2007

Related U.S. Application Data

(62) Division of application No. 11/175,159, filed on Jul. 7, 2005, now abandoned.

(30) Foreign Application Priority Data

Apr. 15, 2005   (JP) .............................. 2005-118024

(51) Int. Cl.
B05B 15/02 (2006.01)
B05B 3/00 (2006.01)
B05C 11/02 (2006.01)

(52) U.S. Cl. ...................... 118/302; 118/313; 118/323; 118/315; 239/106; 239/110; 239/121

(58) Field of Classification Search ................... 118/52, 118/56, 319, 320, 313–315, 612, 302, 321, 118/323; 427/240, 425; 438/780, 782; 396/604, 396/611, 627; 239/549–551, 556, 106, 110, 239/120–121; 134/153, 198, 902, 94.1, 155, 134/171, 104.2, 167 C See application file for complete search history.

(56) References Cited

U.S. PATENT DOCUMENTS 5,658,615 A   8/1997   Hasebe et al.

(Continued)

FOREIGN PATENT DOCUMENTS

JP      3227642      9/2001

(Continued)

*Primary Examiner*—Yewebdar T Tadesse
(74) *Attorney, Agent, or Firm*—Smith, Gambrell & Russell, LLP

(57) ABSTRACT

In a nozzle unit 4 equipped with processing-liquid nozzles 4A to 4J, an air layer 73 and a solvent layer 74 for processing liquid are successively formed outside a processing-liquid layer 71 included in the tip of each nozzle 4A (4B to 4J). Next, the solvent layer 74 in the nozzle 4A is thrown out into a drain part 62 of a standby unit 6 and subsequently, the processing liquid is supplied from the nozzle 4A to the surface of a wafer W, performing a coating process. After completing the coating process, the processing liquid remaining in the nozzle 4A is sucked and continuously, respective tips of the nozzles 4A to 4J are dipped into respective solvents in solvent reservoir 62A to 62J, respectively. From this state, by sucking in the nozzle 4A, there are newly formed, outside the processing layer 71 in the tip of the nozzle 4A, an air layer 73 and a solvent layer 74. Thus, in supplying a substrate, such as semiconductor wafer, with a processing liquid by use of a nozzle unit having a plurality of processing-liquid nozzles integrated, it is possible to prevent dryness of the processing liquids in the respective nozzles while preventing the nozzle unit from being large-sized.

3 Claims, 16 Drawing Sheets

U.S. PATENT DOCUMENTS

| | | | |
|---|---|---|---|
| 5,772,764 A | 6/1998 | Akimoto | |
| 5,938,847 A * | 8/1999 | Akimoto et al. | 118/665 |
| 7,153,364 B1 * | 12/2006 | Rangarajan et al. | 118/326 |
| 2003/0059534 A1 | 3/2003 | Nishijima et al. | |
| 2005/0188919 A1 * | 9/2005 | Nguyen | 118/300 |

FOREIGN PATENT DOCUMENTS

| | | |
|---|---|---|
| JP | 2003-178965 | 6/2003 |

* cited by examiner

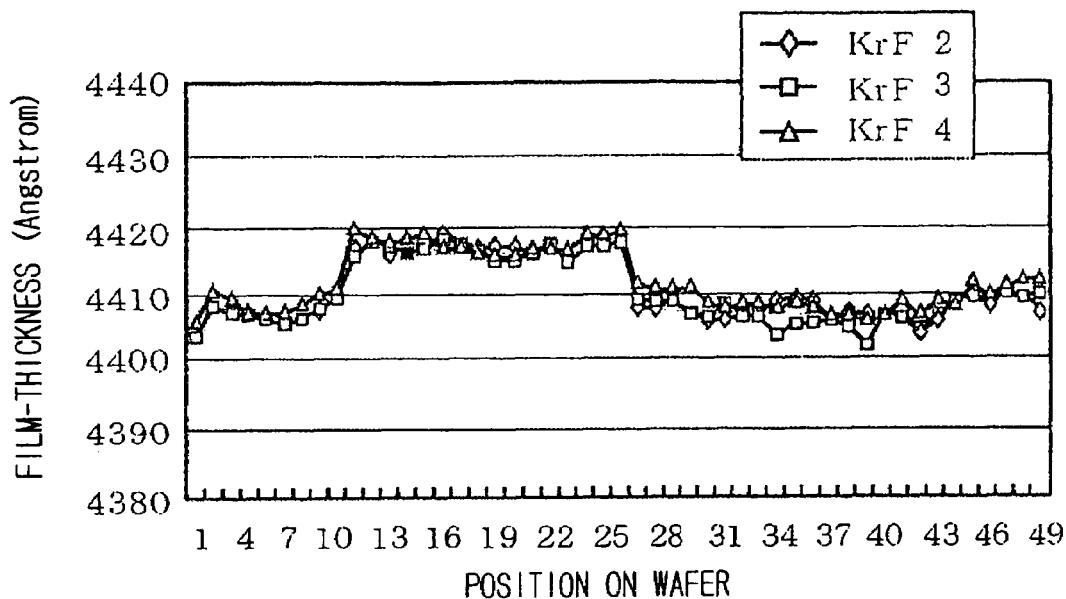
F I G. 14A
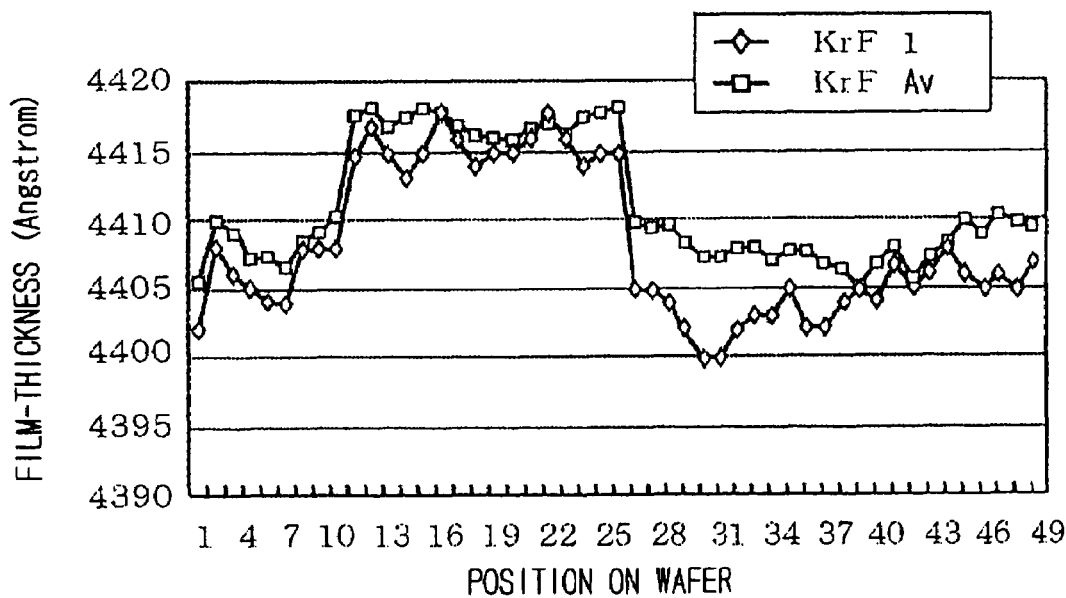
F I G. 14B

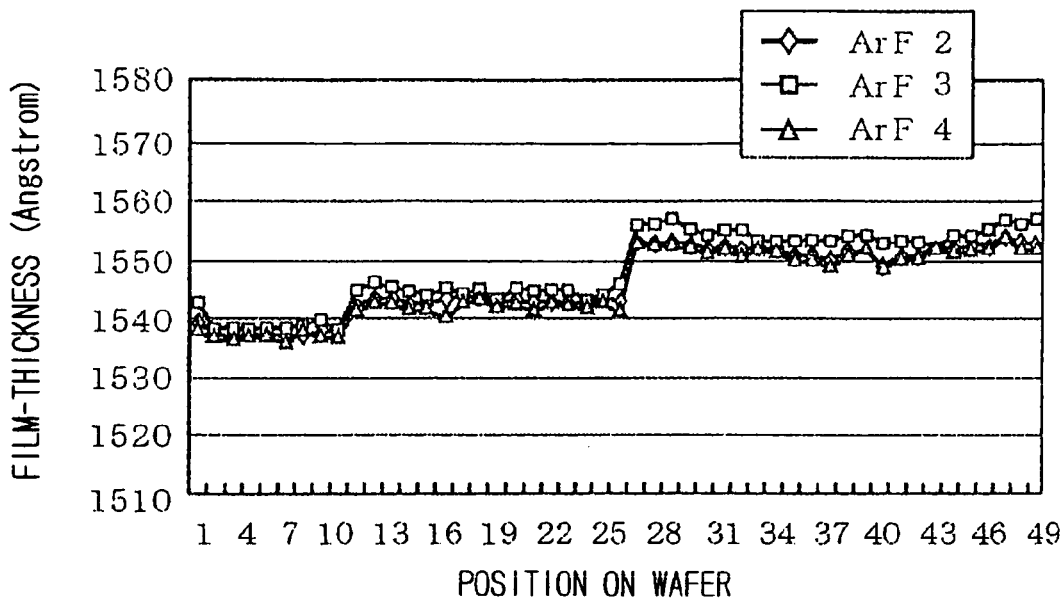
F I G. 15A
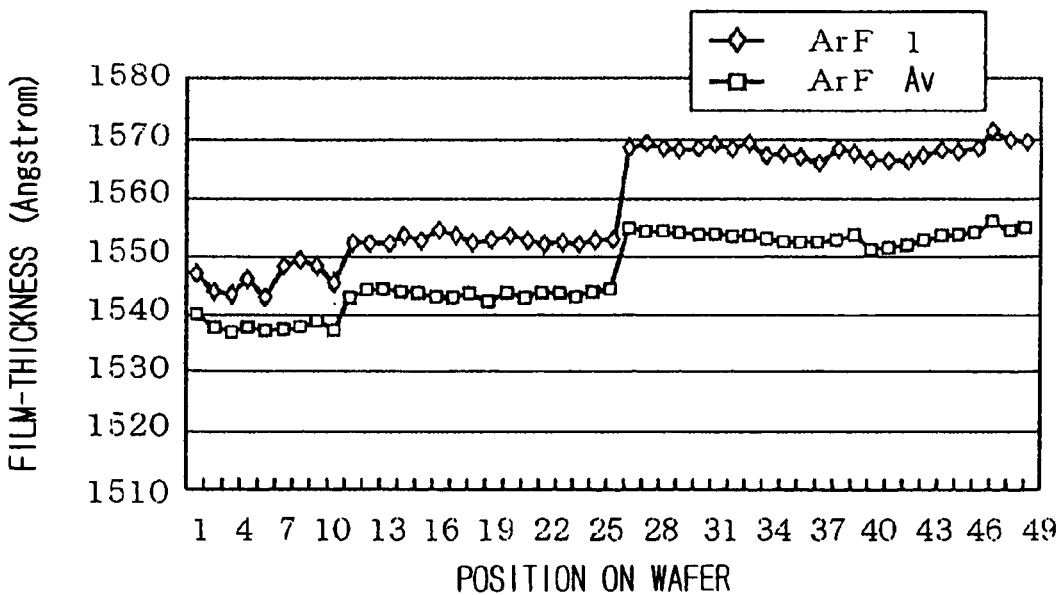
F I G. 15B

LIQUID PROCESSING METHOD AND LIQUID PROCESSING APPARATUS

CROSS REFERENCE TO RELATED APPLICATION

This application is a division of Ser. No. 11/175,159, filed Jul. 7, 2005 now abandoned, and is being incorporated in its entirety herein by reference.

BACKGROUND OF THE INVENTION

1. Field of the Invention

This invention relates to liquid processing method and apparatus for performing a coating process of processing liquid, such as resist liquid, to a substrate, for example, semiconductor wafer.

2. Background Art

In the manufacturing process for semiconductor devices or LCD substrates, a manufacturing technology called "photo lithography" is employed to form a desired resist pattern on the surface of a substrate. This technique is carried out during a series of processes of: coating resist liquid on a substrate, for example, semiconductor wafer that will be referred "wafer" hereinafter; exposing the resist liquid in accordance with a designated pattern; and developing the substrate after the exposure to form a desired pattern on the substrate.

The above coating process of the resist liquid is accomplished by first dropping the resist liquid onto the substantial center of a wafer supported by e.g. a spin chuck through application nozzles and secondly rotating the wafer to allow the resist liquid on the surface of the wafer to spread the same liquid from the center of the wafer to the periphery.

In the coating process, plural kinds of resist liquids may be used corresponding to the kinds of base films to be formed beneath the resist film, etching selectivities, thickness of the resist film and so on. In a constitution where coating nozzles are prepared for every resist liquids of different kinds and a common drive arm drives the coating nozzles between their standby positions and processing positions for applying the resist liquids, there are required many operative steps by the common drive arm grasping each of the application nozzles one after another and also troublesome tasks by the drive arm positioning the application nozzles to the wafer individually. From this point of view, the introduction of an "all-in-one" type coating nozzle unit having a plurality of nozzles built-in is recently contemplated, as shown with reference numeral 1 of FIG. 17 (see Japanese Patent Publication No. 3227642).

Meanwhile, since the resist liquid generally includes components of a resist film made of organic materials and a solvent for the components, such as thinner liquid, the resist liquid is easy to evaporate due to its contact with atmosphere. In order to prevent such evaporation of the resist liquid, therefore, there has been conventionally attempted a suck-back operation where the resist liquid is sucked into an application nozzle by e.g. approx. 2 mm after applying the resist liquid on a wafer, thereby establishing a condition where it is difficult for the resist liquid to contact with the atmosphere.

In spite of the above measure, however, the resist liquid has the tendency of evaporating with a passage of time. Therefore, if performing the coating process with the use of a coating nozzle where a predetermined interval has lapsed since the previous coating, then the resist liquid whose concentration has changed due to its dryness is applied, so that coating defectiveness is produced. Under such a situation, the coating process is practically carried out after throwing out the resist liquid dragged into the coating nozzles. Additionally, besides the above drainage before coating the resist liquid on a wafer, periodical drainage of the resist liquid in the nozzles has been performed in view of maintaining the quality of resist liquid in the nozzles.

We now discuss the coating process with the use of the above-mentioned all-in-one coating nozzle unit 1. Here, it should be noted that a single nozzle is activated and the other nozzles are not activated during the coating process. During the coating process, nevertheless, these nozzles not in use also move above a wafer W, together with the nozzle in use. Consequently, the resist liquid in the unused nozzles comes into contact with atmosphere, precipitating its dryness. Therefore, in the structure disclosed in the above publication No. 3227642, the coating nozzle unit 1 is covered with a cover body 11 and additionally, the cover body 11 is filled up with a thinner liquid 12 in view of preventing dryness of the resist liquid in the nozzle unit 1. In FIG. 17, reference numeral 13 denotes holes that are formed in the cover body 11 to discharge the resist liquid from the nozzles, corresponding to the nozzles respectively, and reference numeral 14 denotes a lid body for opening the holes 13 selectively.

However, it should be noted that the above-mentioned nozzle unit 1 is large-sized due to the installation of the cover body 11 outside the nozzles. If the number of nozzles built in the nozzle unit 1 increases, then it is large-sized furthermore. In spite of filling the interior of the cover body 11 with the thinner liquid 12, the actual coating process is carried out under conditions where the thinner liquid 12 is discharged from the cover body 11. Therefore, since the nozzles not in use are not blocked off from the atmosphere perfectly, the evaporation of the resist liquid in the nozzles is accelerated in consequence.

Thus, in case of the next coating process with the use of a different nozzle, the resist liquid in this nozzle has to be discharged in advance of the coating process. Additionally, as for a less frequently used nozzle, it is required to perform a periodical drainage of the resist liquid in such a nozzle frequently.

In this way, if it is carried out to drain the resist liquid from the nozzle with respect to each application of the coating liquid or periodically, then such an expensive resist liquid is wasted, so that an increased consumption of the resist liquid causes the manufacturing cost to be elevated. Under a situation, we and our inventors of the present invention are considering a method of reducing waste of the resist liquid without draining it with the adoption of a technique disclosed in Japanese Patent Publication (Kokai) No. 2003-178965. According to the technique, an air layer and a thinner layer are formed outside the resist liquid in the coating nozzle. That is, by suppressing contact of the resist liquid with atmosphere to prevent dryness of the resist liquid, its drainage before the coating process is prevented.

In the above publication No. 2003-178965, however, it is not supposed to apply this technique on an all-in-one type coating nozzle unit equipped with a plurality of nozzles. Additionally, there is neither description about a technique of forming the air layers and the thinner layers in a plurality of nozzles effectively nor description about a technique of first coating with the use of one nozzle and subsequently coating with the used of the other nozzle. Therefore, it should be noted that the concretization could not be attained by only the technique disclosed in the publication.

SUMMARY OF THE INVENTION

In the above-mentioned situation, it is an object of the present invention to supply a substrate with processing liquids with the use of a nozzle unit having a plurality of processing-liquid nozzles formed integrally while preventing dryness of the processing liquids in the processing-liquid and also preventing the nozzle unit from being large-sized.

In order to accomplish the above object, an aspect of the present invention provides a liquid processing method with use of a nozzle unit having a plurality of processing-liquid nozzles arranged integrally and also connected to respective processing-liquid supply passages, for supplying a surface of a substrate with a processing liquid via one of the processing-liquid nozzles, the method comprising the steps of:

forming a processing-liquid layer, an air layer and a solvent layer in each tip of the processing-liquid nozzles of the nozzle unit, in order from the side of the processing-liquid supply passages;

subsequently discharging the solvent layer from one of the processing-liquid nozzles of the nozzle unit to a drain part;

supplying the surface of the substrate with a processing liquid through the one processing-liquid nozzle;

sucking the processing liquid remaining in the one processing-liquid nozzle so as to cause a liquid level of the processing liquid in the one processing-liquid nozzle to retreat toward the processing-liquid supply passages; and dipping the tip of at least the one processing-liquid nozzle of the nozzle unit into a solvent in a solvent reservoir for storing the solvent of the processing liquid; and sucking the one processing-liquid nozzle so as to cause the liquid level of the processing liquid in the one processing-liquid nozzle to further retreat toward the processing-liquid supply passages and also cause the solvent in the solvent reservoir to be sucked into the tip of the one processing-liquid nozzle, thereby forming a processing-liquid layer, an air layer and a solvent layer in the tip of the one processing-liquid nozzle, in order from the side of the processing-liquid supply passages.

Another aspect of the present invention provides a liquid processing method with use of a nozzle unit having a plurality of processing-liquid nozzles arranged integrally and also connected to respective processing-liquid supply passages, for supplying a surface of a substrate with a processing liquid via one of the processing-liquid nozzles, the method comprising:

a first step of forming a processing-liquid layer, an air layer and a solvent layer in each tip of the processing-liquid nozzles of the nozzle unit, in order from the side of the processing-liquid supply passages; and a second step of refilling the solvent layer reduced due to its evaporation after a predetermined time has passed since an execution of the first step; wherein the second step includes the steps of:

discharging the solvent layers from the respective processing-liquid nozzles of the nozzle unit to a drain part;

dipping respective tips of the processing-liquid nozzles of the nozzle unit into a solvent in a solvent reservoir for storing the solvent of the processing liquid; and sucking the processing-liquid nozzles so as to cause liquid levels of the processing liquids in the processing-liquid nozzles to retreat toward the processing-liquid supply passages and also cause the solvent to be sucked into the tips of the processing-liquid nozzles, thereby forming a processing-liquid layer, an air layer and a solvent layer in the each tip of the processing-liquid nozzles, in order from the side of the processing-liquid supply passages.

In common with the above-mentioned methods, when the step of supplying the surface of the substrate with the processing liquid through the one processing-liquid nozzle is done by supplying the processing liquid to the substrate during rotating, it is preferable that the plural processing-liquid nozzles of the nozzle unit are arranged on a straight line passing through a rotational center of the substrate and that the solvent reservoir and the drain part are arranged on a straight line passing through the rotational center of the substrate.

Further, it is preferable that the step of dipping the tip of at least the one processing-liquid nozzle of the nozzle unit into the solvent is done by dipping respective tips of the processing-liquid nozzles into respective solvent reservoirs provided for every processing-liquid nozzles, respectively. Still further, preferably, the step of discharging the solvent layer from the one processing-liquid nozzle is done by moving the processing-liquid nozzles to a common drain part and subsequently discharging the solvent layer from each of the processing-liquid nozzles. The solvent reservoir and the drain part may be arranged in a common container adjacently.

According to the present invention, there is also provided a liquid processing apparatus comprising:

a substrate holder for holding a substrate horizontally;

a nozzle unit in which a plurality of processing-liquid nozzles are provided in a common support integrally, the processing-liquid nozzles being connected to respective processing-liquid supply passages to each supply the substrate held by the substrate holder with a processing liquid;

a solvent reservoir for storing a solvent of the processing liquid, the solvent reservoir being arranged so as to allow either part or all of the processing-liquid nozzles of the nozzle unit to dip tips thereof into the solvent;

a drain part arranged so as to allow part of the processing-liquid nozzles of the nozzle unit to discharge the processing liquid;

suck means for sucking the each processing-liquid nozzles of the nozzle unit;

transfer means for transferring the nozzle unit among the solvent reservoir, the drain part and a position to supply the substrate with the processing liquids; and a controller including a program to control the suck means and the transfer means so as to perform the steps of: discharging the solvent layer from one of the processing-liquid nozzles of the nozzle unit to a drain part; supplying the surface of the substrate with a processing liquid through the one processing-liquid nozzle; sucking the processing liquid remaining in the one processing-liquid nozzle so as to cause a liquid level of the processing liquid in the one processing-liquid nozzle to retire toward the processing-liquid supply passages; dipping the tip of at least the one processing-liquid nozzle of the nozzle unit into a solvent in a solvent reservoir for storing the solvent for the processing liquid; and sucking the one processing-liquid nozzle so as to cause the liquid level of the processing liquid in the one processing-liquid nozzle to further retire toward the processing-liquid supply passages and also cause the solvent in the solvent reservoir to be sucked into the tip of the one processing-liquid nozzle, thereby forming a processing-liquid layer, an air layer and a solvent layer in the tip of the one processing-liquid nozzle, in order from the side of the processing-liquid supply passages.

Furthermore, there is also provided a liquid processing apparatus comprising:

a substrate holder for holding a substrate horizontally;

a nozzle unit in which a plurality of processing-liquid nozzles are provided in a common support integrally, the processing-liquid nozzles being connected to respective processing-liquid supply passages to each supply the substrate held by the substrate holder with a processing liquid;

a solvent reservoir for storing a solvent of the processing liquid, the solvent reservoir being arranged so as to allow either part or all of the processing-liquid nozzles of the nozzle unit to dip tips thereof into the solvent;

a drain part arranged so as to allow part of the processing-liquid nozzles of the nozzle unit to discharge the processing liquid;

suck means for sucking the each processing-liquid nozzles of the nozzle unit;

transfer means for transferring the nozzle unit among the solvent reservoir, the drain part and a position to supply the substrate with the processing liquids; and a controller including a program to control the suck means and the transfer means so as to perform the steps of: forming a processing-liquid layer, an air layer and a solvent layer in each tip of the processing-liquid nozzles of the nozzle unit, in order from the side of the processing-liquid supply passages; and refilling the solvent layer reduced due to its evaporation after a predetermined time has passed since an execution of the forming step. Here, the refilling step further includes the steps of: discharging the solvent layers from the respective processing-liquid nozzles of the nozzle unit to a drain part; dipping respective tips of the processing-liquid nozzles of the nozzle unit into a solvent in a solvent reservoir for storing the solvent for the processing liquid; and sucking the processing-liquid nozzles so as to cause liquid levels of the processing liquids in the processing-liquid nozzles to retire toward the processing-liquid supply passages and also cause the solvent to be sucked into the tips of the processing-liquid nozzles, thereby forming a processing-liquid layer, an air layer and a solvent layer in the each tip of the processing-liquid nozzles, in order from the side of the processing-liquid supply passages.

In common with the above-mentioned apparatus, when supplying the surface of the substrate rotated by the substrate holder with the processing liquid through the one processing-liquid nozzle, it is preferable that the plural processing-liquid nozzles of the nozzle unit are arranged on a straight line passing through a rotational center of the substrate and that the solvent reservoir and the drain part are arranged on a straight line passing through the rotational center of the substrate.

Further, the nozzle unit may further include a solvent nozzle connected to a solvent supply passage to supply the substrate held by the substrate holder with a solvent for the processing liquid. Still further, it is preferable that the plural processing-liquid nozzles and the solvent nozzle are together arranged on a straight line passing through the rotational center of the substrate. Preferably, the solvent reservoir is provided with respect to each of the processing-liquid nozzles, correspondingly. The solvent reservoir and the drain part may be arranged in a common container adjacently. Similarly, the drain part may be provided corresponding to the solvent nozzle.

According to the present invention, since the air layer and the solvent layer for the processing liquid are formed outside the processing liquid in each processing-liquid nozzle in the supply of a substrate with the processing liquid with the use of the nozzle unit having a plurality of the processing-liquid nozzles formed integrally, the contact of the processing liquid with atmosphere is suppressed, whereby it is possible to prevent the processing liquid in the processing-liquid nozzles not in use from being evaporated while preventing the nozzle unit from being large-sized.

Additionally, in the present invention, since the processing-liquid nozzle(s) used for the supply of the processing liquid is subjected to the first suction and the second suction upon dipping a tip(s) of the above nozzle(s) into the solvent for the processing liquid, it is possible to form an air layer and a solvent layer outside the processing liquid again, whereby dryness of the processing liquid in the above nozzle(s) can be prevented.

Still further, since the present liquid-processing method includes the step of refilling the solvent layer reduced due to its evaporation after a predetermined time has passed since the formation of the processing-liquid layer, the air layer and the solvent layer in each tip of the processing-liquid nozzles in order from the side of the processing-liquid supply passages, it is possible to suppress dryness of the processing liquid in the processing-liquid nozzles in spite of the passage of the predetermined time.

According to the present invention, the plural processing-liquid nozzles of the nozzle unit are arranged on the straight line passing through the rotational center of the substrate and the solvent reservoir and the drain part are arranged on the straight line passing through the rotational center of the substrate. Thus, by moving the processing-liquid nozzles in one direction horizontally and elevating the nozzles, it is possible to transfer the nozzle unit among one position where the processing-liquid nozzle supplies the substrate with the processing liquid, another position where the solvent layer is discharged from the processing-liquid nozzle into the drain part and the other position where the processing-liquid nozzle sucks in the solvent from the solvent reservoir. Therefore, as it eliminates the need for a driving mechanism for moving the nozzle unit to another direction horizontally, it is possible to simplify the mechanism for moving the nozzle unit.

These and other objects and features of the present invention will become more fully apparent from the following description and appended claims taken in conjunction with the accompany drawings.

BRIEF DESCRIPTION OF THE DRAWINGS

FIG. 11 is a plan view showing one example of a resist-pattern formation apparatus where the above coating apparatus is built in;

FIGS. 14A and 14B are characteristic diagrams showing the in-plane uniformity of film thickness on a wafer in view of confirming an effect of the invention;

FIGS. 15A and 15B are characteristic diagrams showing the in-plane uniformity of film thickness on a wafer in view of confirming an effect of the invention;

DESCRIPTION OF THE PREFERRED EMBODIMENT

Figure 1:
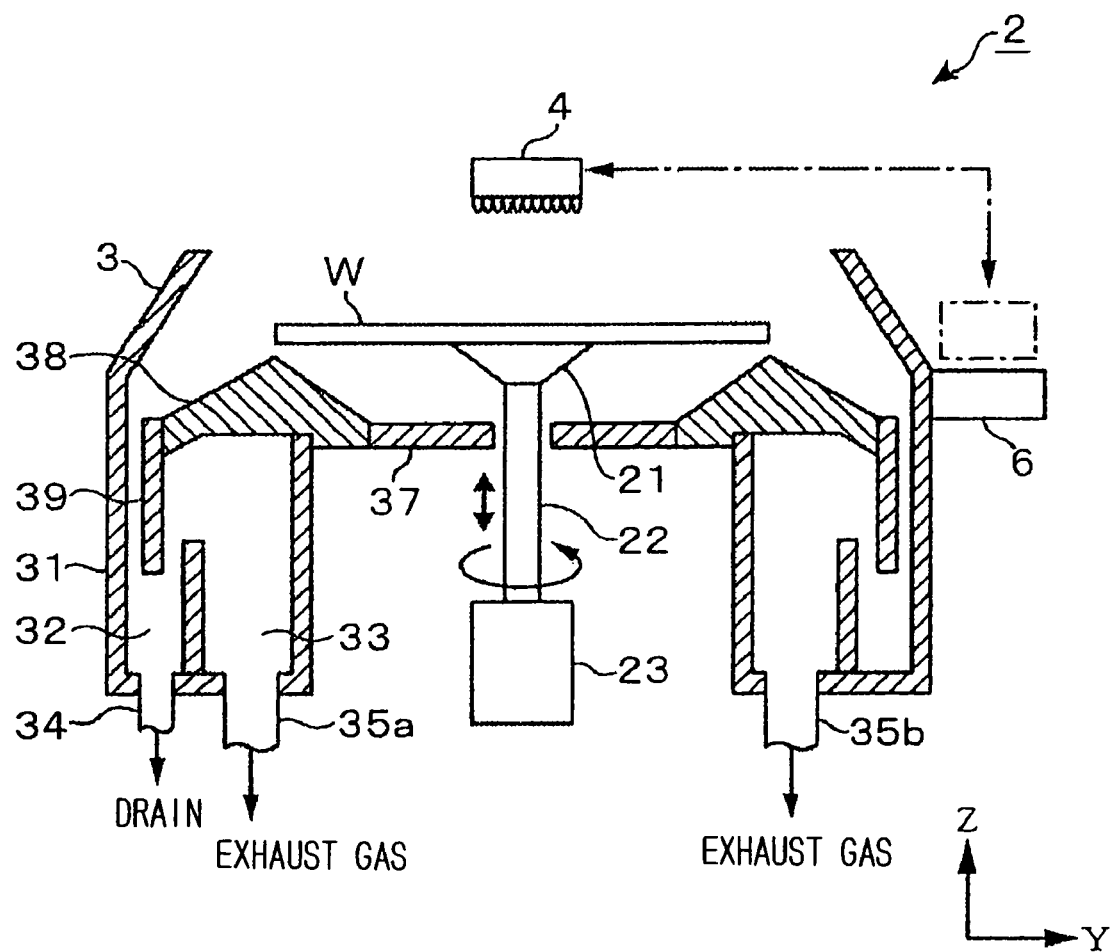
FIG. 1 is a sectional view showing an embodiment where the present invention is applied to a coating apparatus.

An embodiment where a liquid processing apparatus of the present invention is applied to a coating apparatus for performing the application process of resist liquid will be described with reference to accompanying drawings. In FIG. 1, reference numeral 2 designates a coating apparatus. The coating apparatus 2 includes a spin chuck 21 forming a substrate holding part to absorb the center part (backside) of a semiconductor wafer W as a substrate, which will be referred "wafer" after, and hold it horizontally. This spin chuck 21 is connected to a driving mechanism (spin chuck motor) 23 through a shaft part 22. Thus, the spin chuck 21 is rotatable and movable up and down by the driving mechanism 23.

Outside the periphery of the wafer W held on the spin chuck 21, there is a cup body 3 that opens upwardly so as to surround the wafer W. The upper portion of the sidewall of the cup body 3 is inclined inwardly in the radial direction. Further, the cup body 3 is provided, on its bottom side, with a liquid receiver 31 in the form of a concave part. The liquid receiver 31 is divided, below and along the whole circumference of the wafer W, to an outside zone 32 and an inside zone 33. A drain passage 34 is connected to the bottom of the outside zone 32 to discharge drains, such as processing liquid, from the zone 32. While, two exhaust passages 35a, 35b are connected to the bottom of the outside zone 32.

A circular plate 37 is arranged below the wafer W, while an annular member 38 is arranged so as to surround the outside of the circular plate 37. On the outer end face of the annular member 38, an end plate 39 is provided so as to extend downwardly and enter the interior of the outside zone 32. With this structure, processing liquid etc. is introduced into the outside zone 32 via respective surfaces of the end plate 39 and the annular member 38. Although not shown in the figure, elevating pins are arranged so as to penetrate the annular member 37 vertically. These elevating pins are constructed so as to be movable up and down while supporting the backside of the wafer W. Due to collaborative work of the elevating pins with main transfer means mentioned later, the wafer W can be transferred to and from the spin chuck 21.

In the figure, reference numeral 4 denotes a nozzle unit for supplying the wafer W held on the spin chuck 21 with processing liquids and solvent for the liquids. As shown in FIGS. 2 to 5B, this nozzle unit 4 includes a plurality of processing-liquid nozzles (e.g. ten nozzles 4A to 4J) for supplying the wafer W with the processing liquid (e.g. resist liquid) and one solvent nozzle 5 for supplying the wafer W with a solvent (e.g. thinner liquid) for the processing liquids. In the nozzle unit 4, these nozzles 4A to 4J and 5 are fixed to a common support 41 into one body. The support 41 is further provided with a not-shown temperature control mechanism.

For example, as shown in FIGS. 3 to 5B, the processing-liquid nozzles 4A to 4J and the solvent nozzle 5 are fixed to the support 41 in a manner that five processing-liquid nozzles 4A to 4E and five processing-liquid nozzles 4F to 4J make a straight line along the longitudinal direction (i.e. Y-axis direction) of the coating apparatus 5 on both sides of the solvent nozzle 5 as a center.

Figure 4:
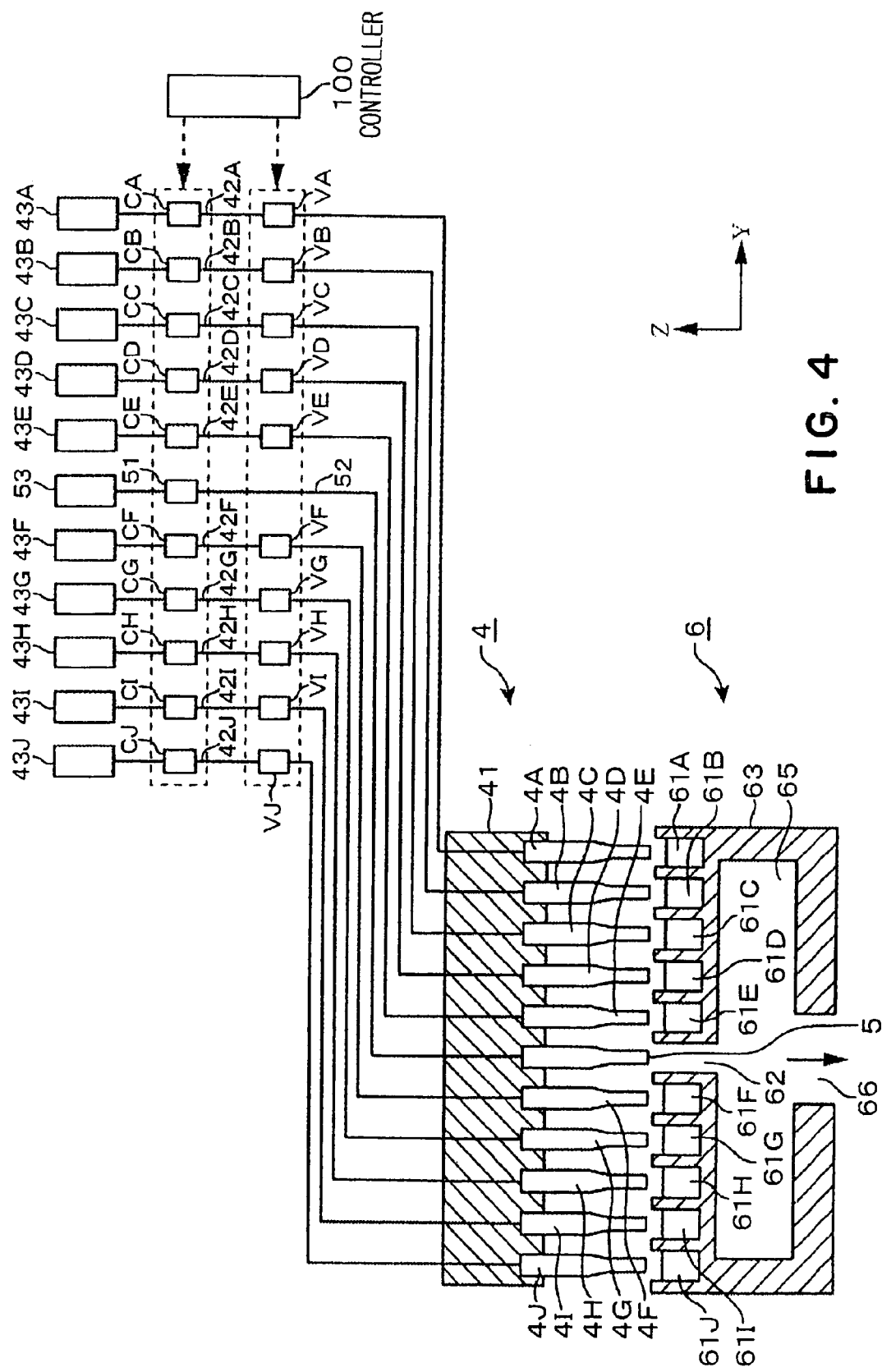
FIG. 4 is a front sectional view showing the above nozzle unit.

As shown in FIG. 4, the processing-liquid nozzles 4A to 4J are communicated with processing-liquid sources 43A to 43J through processing-liquid supply passages 42A to 42J interposed by suck-back valves VA to VJ and flow control units CA to CJ having respective valves, respective massflow controllers and so on, respectively. These processing-liquid supply passages 42A to 42J and one or more nozzle temperature-control pipes (e.g. two pipes—not shown) for supplying fluids, whose temperatures are controlled by the above temperature control mechanism, are together made from flexible material so as not to interfere with later-mentioned movements of the nozzle unit 4. Further, the processing-liquid supply passages 42A to 42J and the not-shown nozzle temperature-control pipes extend to the underside of a later-mentioned base plate 48, in a bundle. Below the base plate 48, for instance, the passages 42A to 42J and the nozzle temperature-control pipes are connected to the suck-back valves VA to VJ, the flow control units CA to CJ, the processing-liquid sources 43A to 43J, a pump, filters, etc.

Figure 6A:
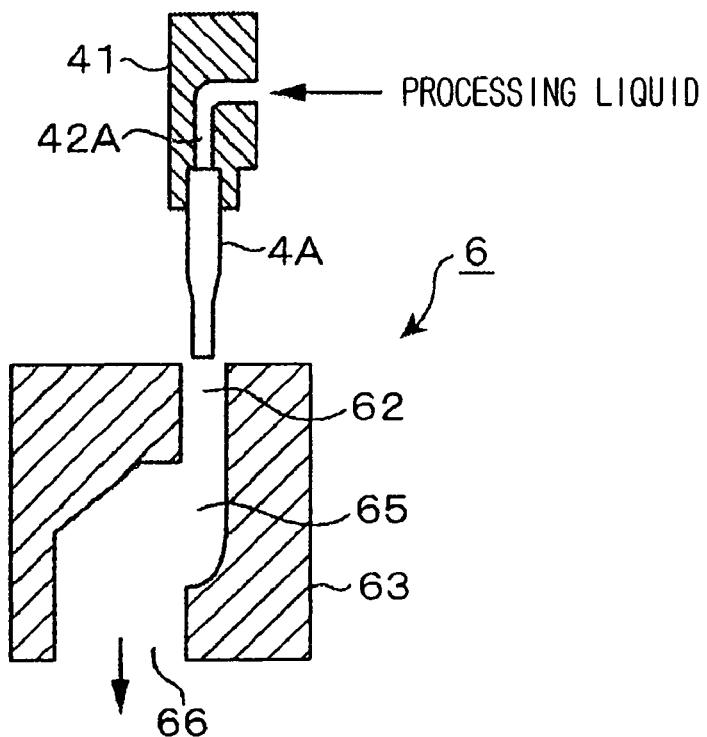
FIGS. 6A and 6B are sectional side views each showing the above nozzle unit.

Now, FIG. 6A shows the processing-liquid supply passage 42A formed in the support 41, for the processing-liquid nozzle 4A. Note, the above-mentioned suck-back valves VA to VJ constitute suck means of the invention, while the flow control units CA to CJ constitute means for controlling the flow rate of the processing liquid. In the processing-liquid sources 43A to 43J, there are stored different kinds of resist liquids or one kind of resist liquid but having different viscosities, for example, I-Line resist liquid, KrF resist liquid, ArF resist liquid, etc., as the processing liquids. The above solvent nozzle 5 is communicated with a solvent source 53 through a solvent supply passage 52. In FIG. 4, reference numeral 51 denotes a flow control valve equipped with a valve, a massflow controller and so on.

The suck-back valves VA to VJ are provided to allow respective liquid levels of the processing liquids, which would remain in the processing-liquid nozzles 4A to 4J when the discharge of the processing liquids via the nozzles 4A to 4J is stopped, to retire (i.e. phenomenon of suck-back) toward the processing-liquid supply passages 42A to 42J. For this purpose, the suck-back valves VA to VJ are respectively equipped with bellows having vacuum chambers in communication with the processing-liquid supply passages 42A to 42J. If the bellows are expanded to form negative pressures in the vacuum chambers, then it becomes possible to make the processing liquids in the nozzles 4A to 4J go back to the corresponding processing-liquid supply passages 42A to 42J. Although not shown, the suck-back valves VA to VJ are respectively provided with needles that allow the maximum volumes of the vacuum chambers to be varied, allowing adjustment of retreating respective distances of the liquid levels of the processing liquids at the tips. The operations of the suck-back valves VA to VJ are controlled by a controller mentioned later.

A standby unit 6 for the nozzle unit 4 is attached to the outer face of the above cup 3. The standby unit 6 is formed so that, for example, all of the processing-liquid nozzles 4A to 4J can dip their tips into the solvents. Thus, corresponding to the processing-liquid nozzles 4A to 4J and the solvent nozzle 5, the standby unit 6 includes solvent reservoirs 61A to 61J and a drain part 62 at the center of the unit 6. In a common container 63, the solvent reservoirs 61A to 61J and the drain part 62s are arranged so as to adjoin each other in a straight line along a direction Y.

FIG. 6A is a longitudinal sectional view of the drain part 62. FIG. 6A is a longitudinal sectional view of the solvent reservoir 61A. In the figures, reference numeral 64A denotes a drain passage that is adjacent to the solvent reservoir 61A.

The respective drain passages 64A (64B to 64J) respectively adjoining the solvent reservoirs 61A (61B to 61J) are communicated with each other and also connected with a drain chamber 65 in communication with the drain part 62. With the structure, the solvents overflowing out of the solvent reservoirs 61A to 61F can flow into the drain chamber 65 through the drain passages 64A to 64J and subsequently, they flow out of the chamber 65 through a drain port 66 formed on the bottom of the container 63.

Figure 2:
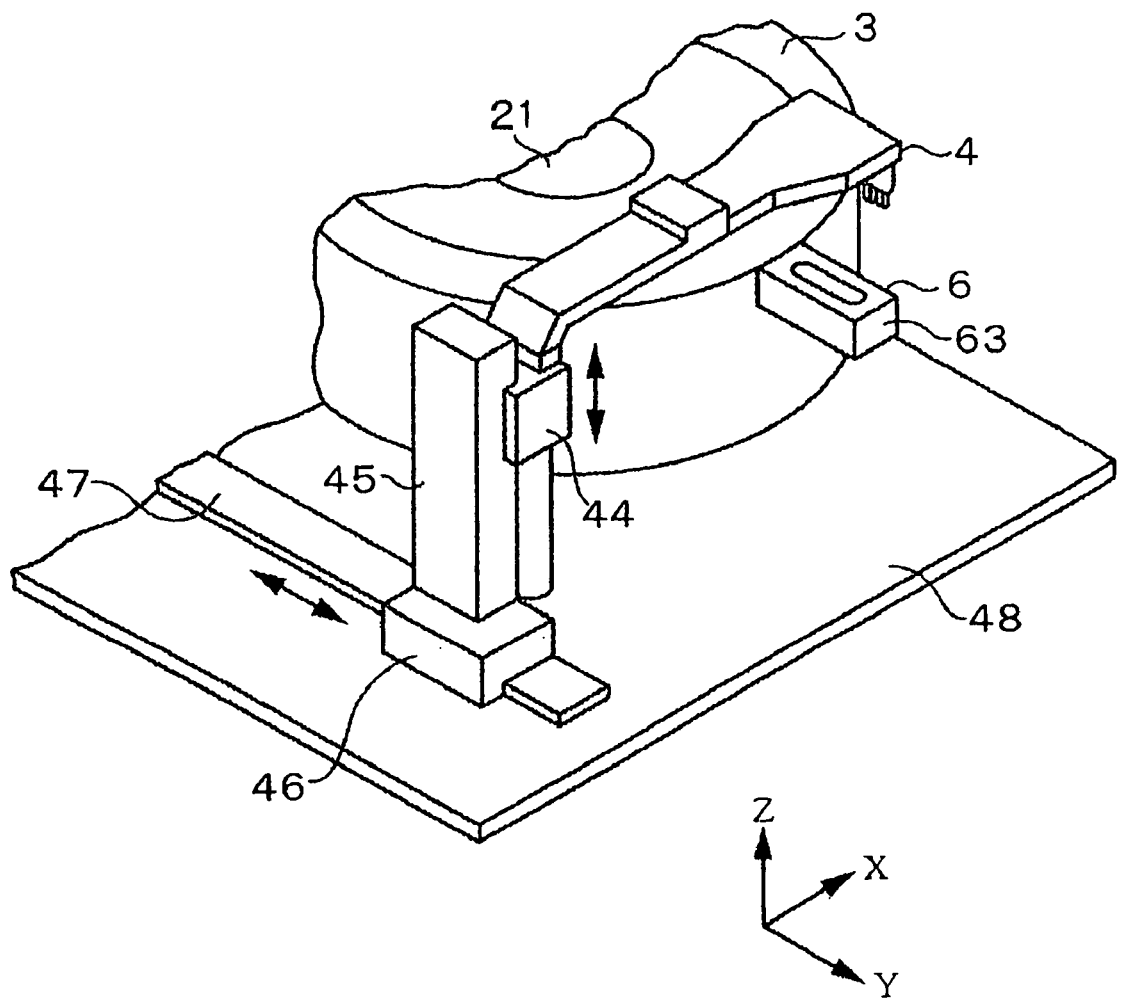
FIG. 2 is a schematic perspective view showing the above coating apparatus.
Figure 3:
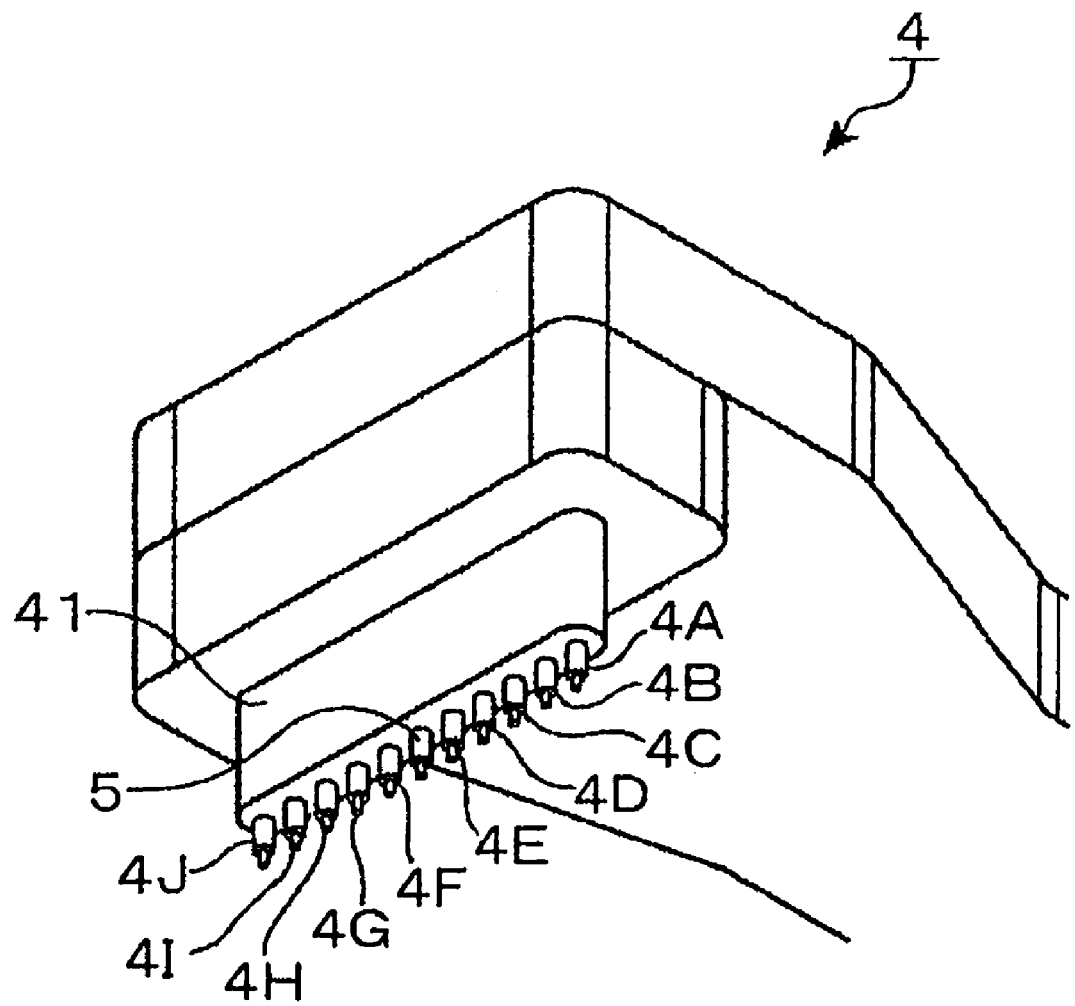
FIG. 3 is a perspective view of a nozzle unit in the above coating apparatus.
Figure 5A:
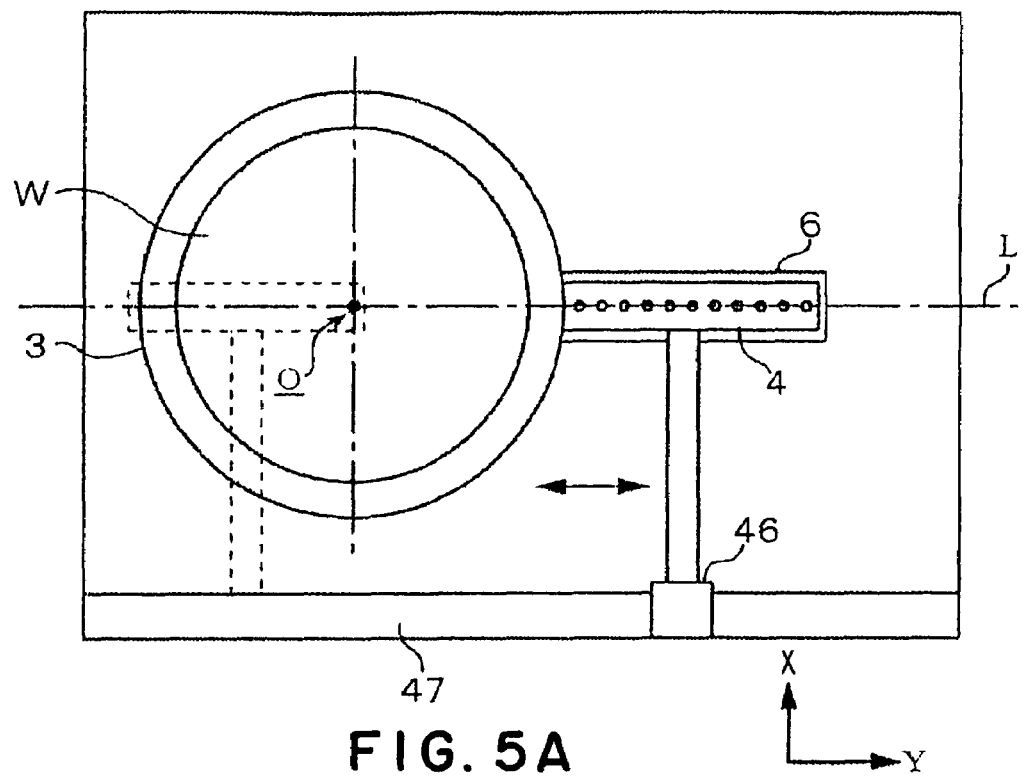
FIGS. 5A and 5B are plan views showing respective positional relationships among the above nozzle unit, a standby unit and a wafer.

As shown in FIGS. 2 and 5A, the nozzle unit 4 is constructed so as to be movable up and down (movable in a direction Z) along an elevating shaft 45 extending in the direction Z due to an elevating mechanism 44. Additionally, along a guide rail 47 extending along the long direction (direction Y) of the coating apparatus 2, the nozzle unit 4 can move on a straight line L passing through the rotational center O of the wafer W due to a horizontal moving mechanism 46. Note, the elevating mechanism 44 and the horizontal moving mechanism 46 do constitute moving means of the invention. Reference numeral 48 designates the above-mentioned base plate.

Figure 5B:
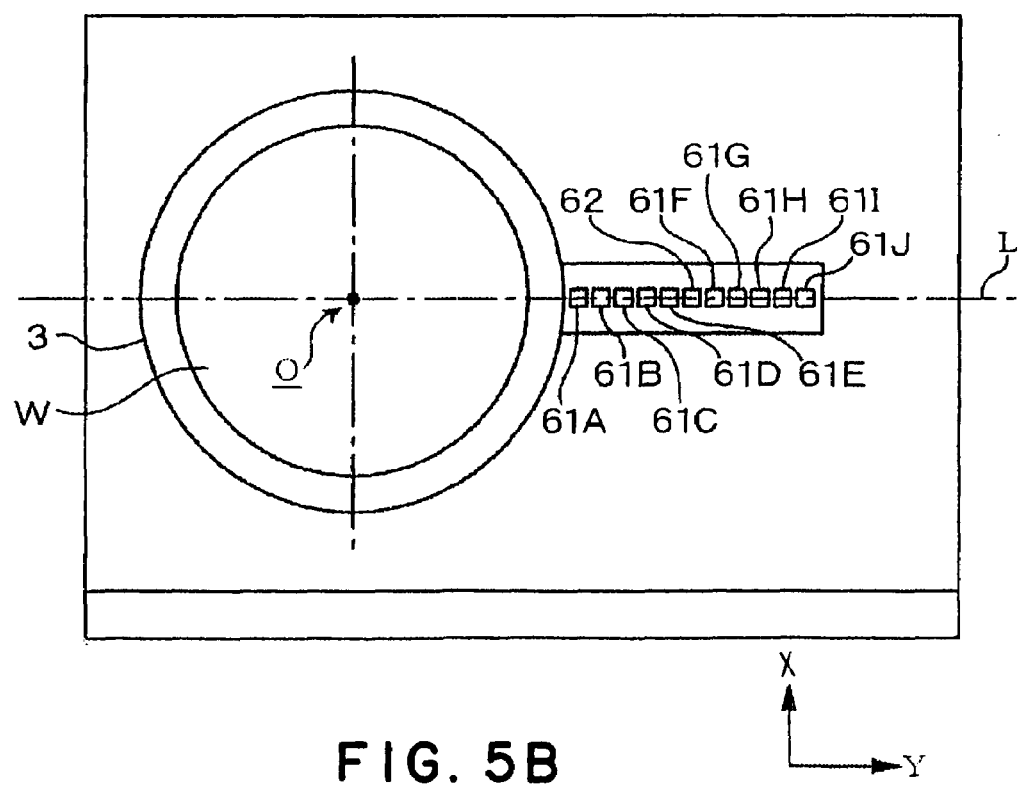

For instance, as shown in FIG. 5A, the processing-liquid nozzles 4A to 4J and the solvent nozzle 5 of the nozzle unit 4 are arranged on the straight line L passing through the rotational center O of the wafer W. Similarly, as shown in FIG. 5B, the solvent reservoirs 61A to 61J and the drain part 62 of the standby unit 6 are positioned on the straight line L passing through the rotational center O of the wafer W. Note that, in FIGS. 5A and 5B, the nozzle unit 4 and the standby unit 6 are represented largely in comparison with the representation of the wafer W for the sake of simply illustration. Additionally, discharge openings at the tips of the nozzles are shown in the figure although they are invisible in a normal state.

The elevating mechanism 44 and the horizontal moving mechanism 46 are formed by, for example, motors. With the above constitution, the nozzle unit 4 is constructed so as to be movable among: a standby position where the tips of the processing-liquid nozzles 4A to 4J are positioned somewhat higher (e.g. approx. 1 to 2 mm higher) than the top surface of the container 63 of the standby unit 6; a position where the processing-liquid nozzles 4A to 4J dip their tips in the solvents in the solvent reservoirs 61A to 61J by approx 1 mm from respective liquid levels of the solvents; and a position where any one of the nozzles 4A-4J and 5 can supply the processing liquid or the solvent to the rotational center of the wafer W. Further, the nozzle unit 4 is movable up and down and also movable in the direction Y to positions where each of the processing-liquid nozzles 4A to 4J can oppose the drain part 62.

The operations of the suck-back valves VA to VJ, the flow control units CA to CJ, the elevating mechanism 44 and the horizontal moving mechanism 46 are all controlled by a controller 100. That is, the suck-back operations of the single processing-liquid nozzle 4A (4B to 4J) or all the processing-liquid nozzles 4A to 4J can be accomplished at a predetermined timing by the controller 100. Additionally, the controller 100 previously stores the amounts of the processing liquids and the solvents to be sucked back, the amounts of the processing liquids and the solvents to be discharged from the processing-liquid nozzle 4A (4B to 4J), controlled variables of the suck-back valves VA to VJ and the flow control units CA to CJ for attaining these amounts to be sucked back or discharged, etc. Thus, the suck-back operations and the discharge operation are carried out in accordance with predetermined processing programs stored in the controller 100.

Next, the present liquid processing method carried by the above-mentioned coating apparatus 2 will be described.

Figure 7A:
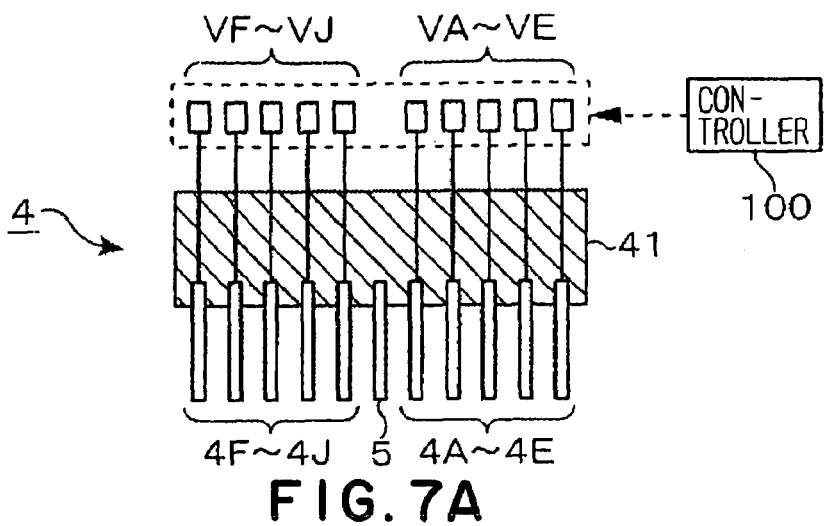
FIGS. 7A, 7B and 7C are process diagrams for explanation of the operation of the above coating apparatus.
Figure 8A:
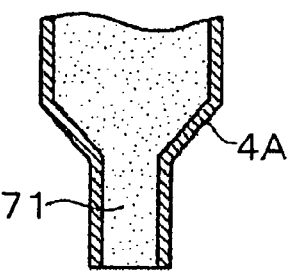
FIGS. 8A, 8B, 8C and 8D are process diagrams for explanation of the operation of the above coating apparatus.
Figure 8B:
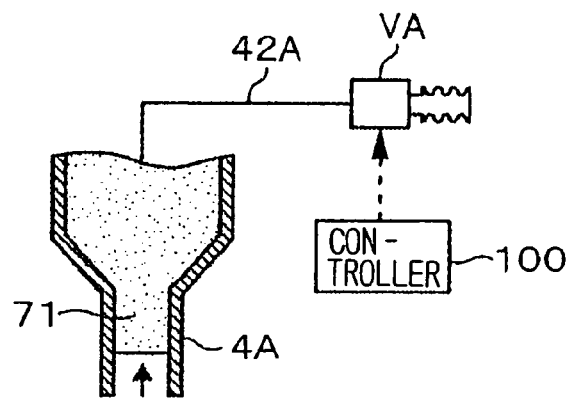

Before performing the coating operation by the coating apparatus 2, it is carried out to form, in order from the sides of the processing-liquid supply passages 42A to 42J, a processing-liquid layer, an air layer and a solvent layer for the processing liquid in each tip of the processing-liquid nozzles 4A to 4J of the nozzle unit 4. In detail, as shown in FIG. 7A, the suck-back valves VA to VJ in the processing-liquid supply passages 42A to 42J for the processing-liquid nozzles 4A to 4J perform the first suck-back operation. Consequently, the liquid level of the processing-liquid layer 71 in each of the processing-liquid nozzles 4A to 4J changes from a pre-suction state (as representatively shown with the processing-liquid nozzle 4A in FIG. 8A) and retreats toward the processing-liquid supply passages 42A, as shown in FIG. 8B. Thus, the liquid level is raised from the tip of the nozzle 4A. In connection, it is desirable to operate the suck-back valve VA so that the liquid level of the processing-liquid layer in the nozzle 4A rises from its tip by approx. 1 to 1.5 mm.

Figure 6B:
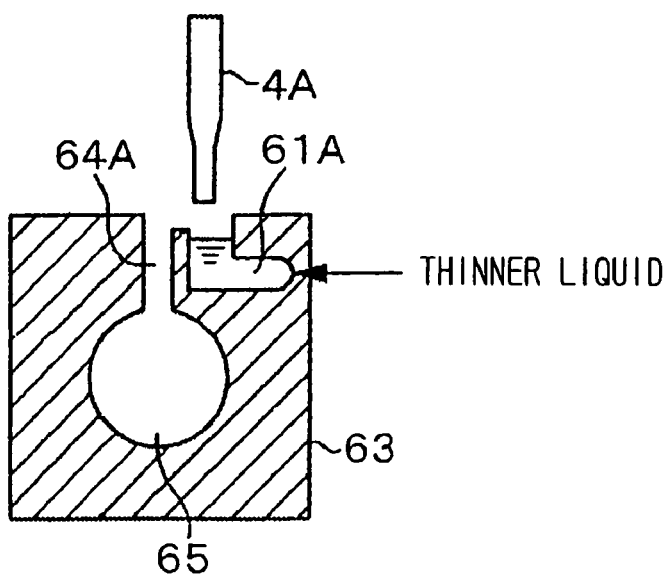
Figure 7B:
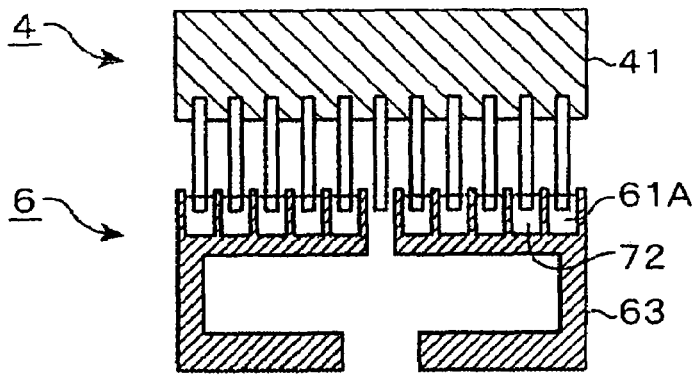
Figure 8C:
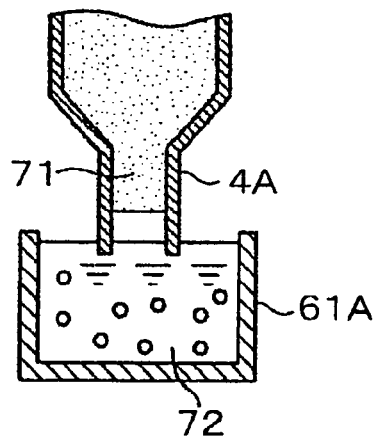

Next, as shown in FIGS. 7B and 8C, it is carried out to move the nozzle unit 4 to a position opposing the standby unit 6 and further performed to allow the processing-liquid nozzles 4A to 4J to dip respective tips into solvents 72 in the solvent reservoirs 61A to 61J. Regarding the supply of the solvent reservoirs 61A to 61J with the solvents, in advance of the above dipping, the solvent nozzle 5 may move to respective position opposing the solvent reservoirs 61A to 61J, in turns where the nozzles further blasts out the solvent into the solvent reservoirs 61A to 61J. Alternatively, the solvent reservoirs 61A to 61J may be respectively provided with thinner suppliers, as shown in FIG. 6B representatively.

Figure 7C:
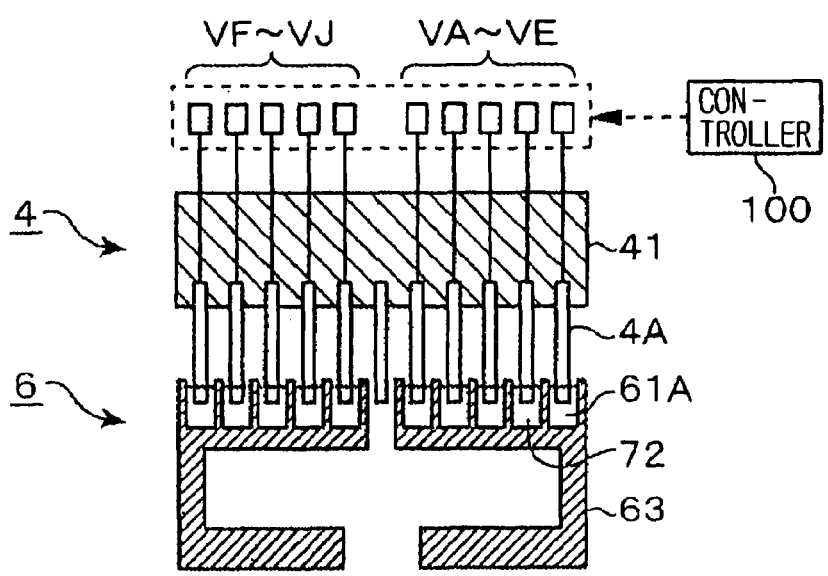
Figure 8D:
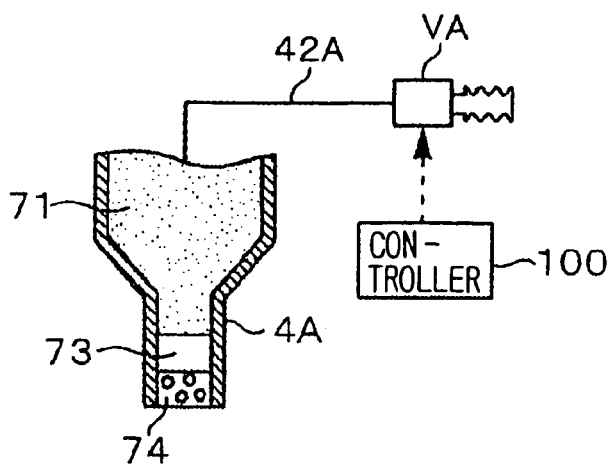

Next, as shown in FIG. 7C, the suck-back valves VA to VJ in the processing-liquid supply passages 42A to 42J for the processing-liquid nozzles 4A to 4J perform the second suck-back operation. Consequently, as shown in FIG. 8D, the liquid level of the processing-liquid layer 71 in each of the processing-liquid nozzles 4A to 4J retreats toward the processing-liquid supply passages 42A to 42J furthermore and the solvents in the solvent reservoirs 61A to 61J are sucked in the tips of the nozzles 4A to 4J. In this way, the processing-liquid layer 71, the air layer 73 and the solvent layer 74 for the processing liquid are formed in each tip of the processing-liquid nozzles 4A to 4J, in order from the sides of the processing-liquid supply passages 42A to 42J.

Now, if the nozzles 4A to 4J of approx. 1.2 to 2 mm in bore diameter are employed, it is preferable that the air layer 73 in each of the nozzles 4A to 4J has a thickness of approx. 2 mm. Regarding the thickness of the solvent layer 74, it depends on a period for preventing dryness of the processing liquid. For instance, if required to prevent dryness of the processing liquid in a period of approx. 2 hours, it is desirable that the solvent layer 74 has a thickness of approx. 1.5 to 2 mm, which will be obvious from later-mentioned experiments. Note, the degree of a rising of the liquid level of the processing-liquid layer 71 from the tip of the nozzle, which is caused by the first suction, and the thicknesses of the air layer 73 and the solvent layer 74 both formed at the second suction are controlled for every nozzles, due to sucking forces of the suck-back valves VA to VJ. In this way, a series of operations where the suction is performed by the suck-back valves VA to VJ under two time frames while interposing the dip of the tips of the nozzles 4A to 4J into the solvent reservoirs 61A to 61J, is carried out on the basis of the process program stored in the controller 100.

Next, citing an instance of the coating operation using one processing-liquid nozzle 4A of the nozzle unit 4 (the rightmost nozzle in FIG. 9A), we describe the coating process of a wafer W performed by the coating apparatus 2 having the nozzle unit 4 where the processing-liquid layers 71, the air layers 73 and the solvent layers 74 are formed in the tips of the nozzles 4A to 4J.

Figure 9A:
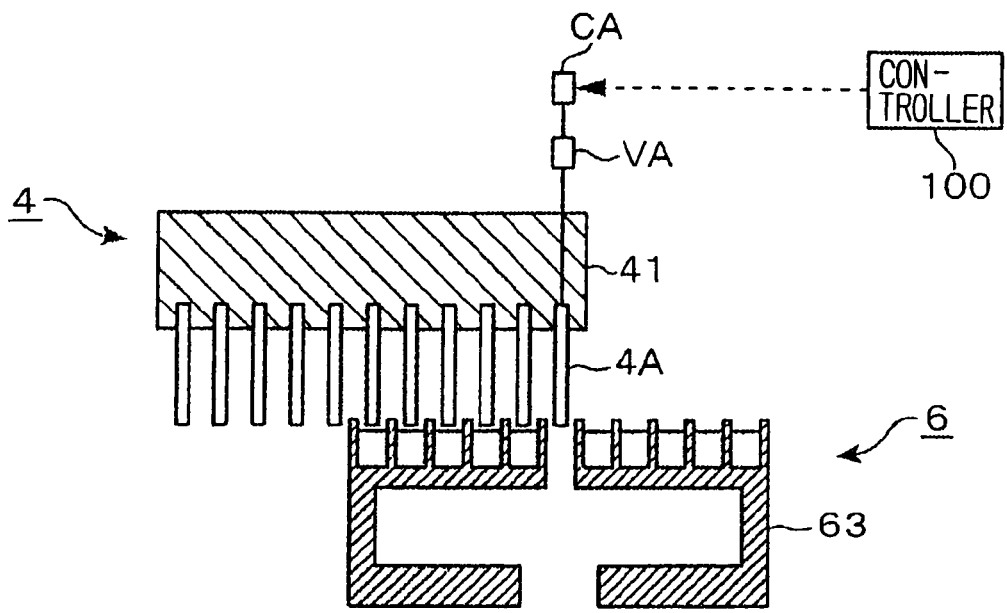
FIGS. 9A, 9B and 9C are process diagrams for explanation of the operation of the above coating apparatus.
Figure 9B:
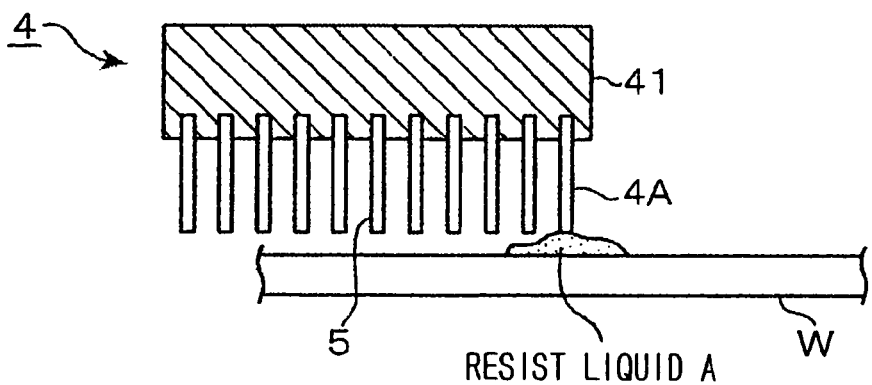

First, it is carried out to discharge the solvent layer 71 from the processing-liquid nozzle 4A. In detail, as shown in FIG. 9A, the nozzle unit 4 is moved so that the processing-liquid nozzle 4A opposes the drain part 62 of the standby unit 6 and a predetermined amount of processing liquid due to the flow control unit CA is discharged from the nozzle 4A. Subsequently, the processing liquid is sucked back. Then, in view of reducing a scrappage amount of the processing liquid, the charge amount of the processing liquid for accomplishing the discharge of the solvent layer 74 only is previously determined by experiments. For instance, the liquid level of the processing liquid is lowered by approx. 2 mm to discharge the solvent layer 74 from the nozzle. Note, a controlled variable for the flow control unit CA allowing the above charge amount of the processing liquid is stored in the controller 100 in advance.

Next, the nozzle unit 4 is moved to a coating position where the processing-liquid nozzle 4A supplies a wafer W with an embrocation (i.e. processing liquid). Then, the processing-liquid nozzle 4A supplies the wafer W with the processing liquid, putting a coating process into execution. In the coating process, the spin chuck 21 is positioned above the cup 3, while a wafer W transferred from the previous step by not-shown main transfer means is delivered onto the spin chuck 21 in corporation with the elevating pins (not shown) and successively, the spin chuck 21 is lowered to a processing position.

Next, the nozzle unit 4 is moved to a position where the solvent nozzle 5 can supply the solvent to the rotational center O of the wafer W held on the spin chuck 21. Then, the wafer W is supplied with a thinner liquid as the solvent. By rotation of the wafer W with the spin chuck 21, the thinner liquid is diffused from the center O up to the periphery of the wafer W due to centrifugal force. Next, the rotation of the spin chuck 21 is stopped and additionally, the nozzle unit 4 is moved to a position where the processing-liquid nozzle 4A can supply a processing liquid to the rotational center O of the wafer W held on the spin chuck 21. In this way, the wafer W is supplied with a resist liquid A as the processing liquid. Similarly, by rotation of the wafer W with the spin chuck 21, the resist liquid A is diffused from the center O up to the periphery of the wafer W due to the centrifugal force. It is noted that the resist liquid A is applied on the wafer W whose surface is getting wet by the thinner liquid. Then, the spin chuck 21 is moved upside the cup 3 and thereafter, the wafer W having the resist liquid A coated thereon is delivered to the not-shown main transfer means by the not-shown elevating pins.

Figure 9C:
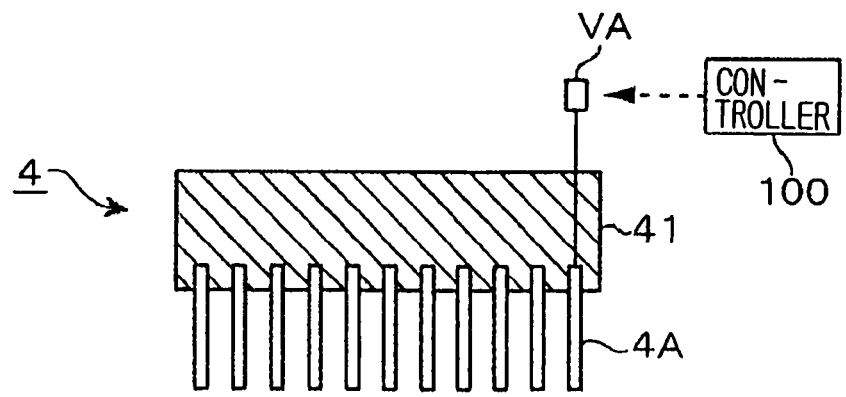
Figure 10A:
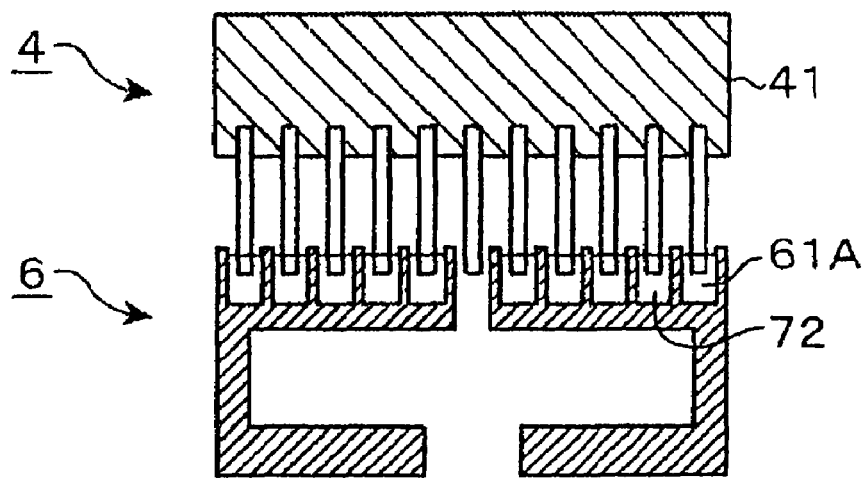
FIGS. 10A and 10B are process diagrams for explanation of the operation of the above coating apparatus.
Figure 10B:
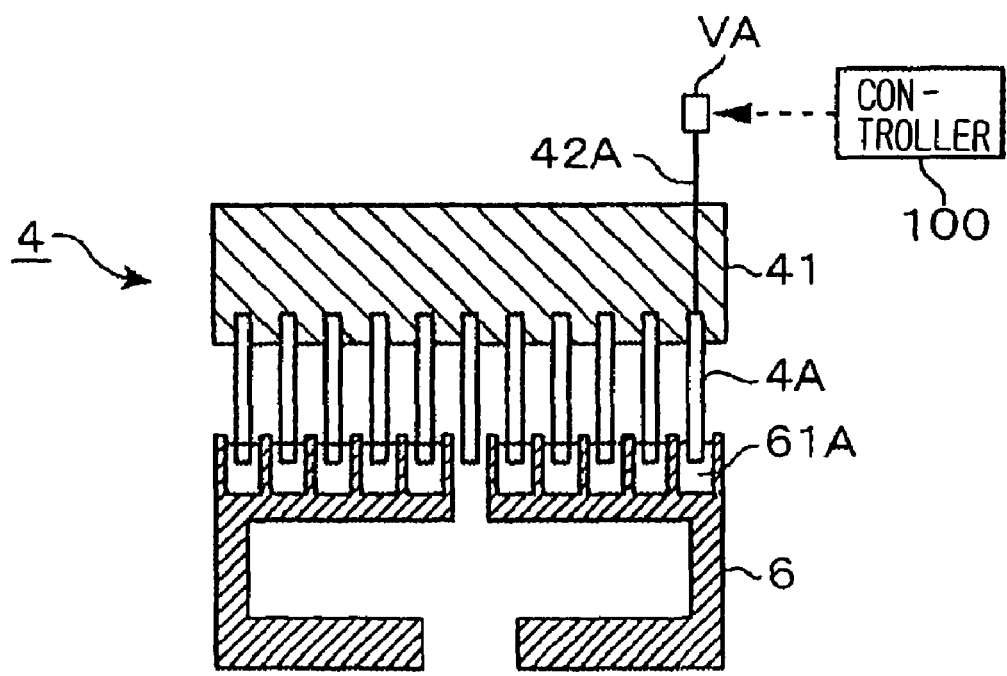

In the meanwhile, if the spouting of the embrocation is not carried out over a predetermined period since the coating process has been completed, it is carried out to form the processing-liquid layer 71, the air layer 73 and the solvent layer 74 in the tip of the processing-liquid nozzle 4A on use. That is, as mentioned before, the suck-back valve VA performs the first suction on the nozzle 4A (see FIG. 9C) and subsequently, the nozzle unit 4 is moved to a position to oppose the standby unit 6 where the nozzles 4A to 4J dip their tips into the solvents 72 in the solvent reservoirs 61A to 61J, as shown in FIG. 10A. In succession, as shown in FIG. 10B, the suck-back valve VA performs the second suction on the used nozzle 4A only. As a result, there are formed the processing-liquid layer 71, the air layer 73 and the solvent layer 74 in the tip of the nozzle 4A, in order from the side of the processing-liquid supply passage 42A. Alternatively, the above-mentioned second suction of the suck-back valve VA may be accomplished by dipping the nozzle 4A into the solvent 72 in any one of the solvent reservoirs 61A to 61J.

Subsequently, in case of coating the wafer W with the use of the processing-liquid nozzle 4B different from the above processing-liquid nozzle 4A, the nozzle unit 4 is moved so that the processing-liquid nozzle 4B opposes the drain part 62 of the standby unit 6, discharging the solvent layer 74 in the nozzle 4B, as similar to the use of the processing-liquid nozzle 4A. Next, the wafer W is coated with a resist liquid B as the processing liquid with the use of the processing-liquid nozzle 4B and successively, it is carried out to form the processing-liquid layer 71, the air layer 73 and the solvent layer 74 in the tip of the processing-liquid nozzle 4B. Then, it is desirable that the nozzle unit 4 normally waits ready in the atmosphere. For instance, the nozzle unit 4 is held in a standby position where the tips of the processing-liquid nozzles 4A to 4J are somewhat higher than the top surface of the container 63 of the standby unit 6 by e.g. approx. 1.5 to 2 mm.

Note, a series of operations of: discharging the solvent from the nozzle 4A; performing the designated coating process, first sucking the used nozzle 4A; dipping its tip into the solvent reservoir; and secondly sucking the nozzle 4A by the suck-back valve Va, and another series of operations for the next coating process with the use of the nozzle 4B, are carried out on the basis of the process program stored in the controller 100.

According to the above-mentioned processing method, since the air layer 73 and the solvent layer 74 are formed outside the processing-liquid layer 71 in each tip of the processing-liquid nozzles 4A to 4J, the contact of the processing-liquid layer 71 with atmosphere can be avoided. In spite of the presence of the air layer 73 between the processing-liquid layer 71 and the solvent layer 74, as the air layer 73 is saturated with evaporation of the solvent, an atmosphere for hydrating the processing liquid is established there to prevent the processing liquids in the processing-liquid nozzles 4A to 4J from evaporating. In addition, owing to the air layer 73 between the processing-liquid layer 71 and the solvent layer 74, the contact of the layer 71 with the layer 74 is suppressed, so that the solvent in the solvent layer 74 can be prevented from mixing with the processing liquid.

In this way, since the dryness of the processing liquid is suppressed by forming the air layers 73 and the solvent layer 74 outside the processing-liquid layers 71 in the processing-liquid nozzles 4A to 4J, there is no possibility that in the "all-in-one" nozzle having a plurality of nozzles formed integrally, the processing liquids in the nozzles not in use are exposed to atmosphere, so that it is possible to suppress dryness of the processing liquid certainly. Additionally, in comparison with an arrangement where a dry-proof member is attached to the nozzle unit 4 having a plurality of nozzles, it is possible to prevent the whole unit 4 from being large-sized. Even if increasing the number of processing-liquid nozzles in the nozzle unit 4, the size of the unit 4 is quit for its increase due to the addition of nozzles.

Further, with the prevention of dryness of the processing liquid in the processing-liquid nozzles 4A to 4J, there is no need to drain the malformed processing liquid as a result of the dryness before the coating process or periodically, where the running cost of the coating apparatus can be saved by restraining the waste of expensive processing liquid.

Since all of the processing-liquid nozzles 4A to 4J are subjected to the first suck-back operation of withdrawing the processing liquids in the respective tips and the second suck-back operation upon dipping the tips into the solvent, it is possible to form the processing-liquid layers 71, the air layers 73 and the solvent layers 74 in all the nozzles 4A to 4J simultaneously, collectively, easily and effectively.

As for the processing-liquid nozzle that has been used to supply the wafer with the processing liquid, since the same nozzle is subjected to the first suction and the second suction upon dipping its tip into the solvent reservoir, it is possible to again form the processing-liquid layer 71, the air layer 73 and the solvent layer 74, whereby the dryness of the processing liquid in the above processing-liquid nozzle can be prevented.

In the nozzle unit 4, additionally, since the processing-liquid nozzles 4A to 4J and the solvent nozzle 5 are arranged on the straight line L passing through the rotational center O of the wafer W and the solvent reservoirs 61A and the drain part 62 are arranged on the straight line L passing through the rotational center O of the wafer W, it is possible to transfer the nozzle unit 4 among a position where each of the processing-liquid nozzles 4A to 4J supplies the wafer W with the processing liquid, another position where the solvent layer 74 is discharged from each of the processing-liquid nozzles 4A to 4J into the drain part 4A to 4J and the other position where each of the processing-liquid nozzles 4A to 4J sucks in the solvent from each of the solvent reservoirs 61A to 61J by moving each of the processing-liquid nozzles 4A to 4J in one direction horizontally (direction Y) and elevating each of the nozzles 4A to 4J. That is, as it allows the nozzle unit 4 to be moved to a designated position without using a driving mechanism for moving the nozzle unit to another direction (direction X) horizontally, it is possible to simplify means for moving the nozzle unit 4.

In addition to the above arrangement of the processing-liquid nozzles 4A to 4J and the solvent nozzle 5, since the solvent reservoirs 61A to 61J and the drain part 62 of the standby unit 6 are arranged on the straight line L passing through the rotational center O of the wafer W so as to correspond to the processing-liquid nozzles 4A to 4J and the solvent nozzle 5 respectively, it is possible to miniaturize the standby unit 6. That is, it is desirable to arrange the solvent reservoirs 61A to 61J in a manner that all of the processing-liquid nozzles 4A to 4J can dip their tips into the solvent in order to form the solvent layers 74 in all of the nozzles 4A to 4J effectively, while the discharge of the solvent layer 74 before the coating process is carried out one nozzle by one nozzle. Thus, it means that the standby unit 6 has only to possess a single drain part 62. In addition to this constitution, since the drain part 62 is arranged so as to oppose the solvent nozzle 5, it is possible to save the installation space of the standby unit 6.

Additionally, due to the individual arrangement of the solvent reservoirs 61A to 61J, it is possible to allow the coating apparatus to meet a situation using a different solvent with respect to each processing liquid. Even if the resist liquid enters the solvent reservoirs 61A to 61J into mixture, there is no possibility that one nozzle is infiltrated by difference resist liquids.

Still further, since the processing-liquid nozzles 4A to 4J are divided into two equal numbers on both sides of the solvent nozzle 5 as the center and correspondingly, the drain part 62 is arranged at the center of the standby unit 6, the moving distances of the nozzle unit 4 to discharge the solvent layers 74 from the processing-liquid nozzles 4A to 4J is reduced in comparison with those in case of arranging the drain part 62 at the extremity of the standby unit 6, improving the operating efficiency of the apparatus.

Next, a process (i.e. the second step) for refilling the solvent layer 74, whose amount has been decreased due to the evaporation, in each of the processing-liquid nozzles 4A to 4J will be described. It is generally noted that the solvent layer 74 is composed of volatile components. Consequently, since the solvent layer 74 vaporizes with a passage of time, the resultant reduction of an amount of the solvent layer 74 may cause an incomplete prevention of dryness of the processing liquid. The second step is provided to meet such a situation. The timing of periodically refilling the solvent layer 74, namely, a period from the previous formation of the layers 71, 73 and 74 for all the nozzles 4A to 4J at the first step till the present formation of the solvent layer 74 is previously determined in compliance with the sorts of solvent forming the formed solvent layer 74, a thickness of the layer 74 formed at the first step and so on.

At the second step, it is firstly performed to discharge the solvent layers 74 from the respective processing-liquid nozzles 4A to 4J. In detail, at first, the nozzle unit 4 is moved so that the first nozzle 4A opposes the drain part 62 of the standby unit 6 and there, the solvent layer 74 is discharged with the supply of a predetermined amount of processing liquid by the flow control unit CA. Thereafter, the similar operation is performed against the other nozzles 4B to 4J, discharging the solvent layers 74 therefrom.

Note, the amount supplied of the processing liquid for discharging only the solvent layer 74 changes depending on a timing of executing the periodical refilling of the solvent layer 74. Thus, by experiments, there are previously obtained an appropriate timing, a discharge rate of the layer 74 at that time, a controlled variable of the flow control unit CA at that time, etc., all of which are further stored in the controller 100 in advance.

Then, the nozzle unit 4 is moved to a position opposing the standby unit 6 where the tips of the processing-liquid nozzles 4A to 4J are dipped into the solvents 72 in the solvent reservoirs 61A to 61J, respectively. In succession, all of the valves 61A to 61J are sucked by the suck-back valves VA to VJ, so that the processing-liquid layers 71, the air layers 73 and the solvent layers 74 are formed in the tips of all the nozzles 4A to 4J.

In the above way, this periodical formation of the solvent layers 74, is accomplished by discharging the solvent layer 74 from each of the nozzles 4A to 4J after a predetermined time has passed since the previous formation of the layers 71, 73 and 74 in all the nozzles 4A to 4J. Alternatively, the above periodical formation may be accomplished by directly dipping the tips of the nozzles 4A to 4J into the solvents 72 of the solvent reservoirs 61A to 61J and subsequently sucking all the nozzles 4A to 4J through the suck-back valves VA to VJ, thereby forming new solvent layers 74 at the tips of all the nozzles 4A to 4J.

Because, even if again forming the solvent layers 74 at a timing of either leaving a predetermined amount of solvent layer 74 or evaporating it almost on condition that the solvent layers 74 have been formed in all the nozzles 4A to 4J in a manner that they would evaporate substantially simultaneously, the adjustment of suction rates by the suck-back valves VA to VJ would allow the layers 74 to be formed with desired thicknesses. Then, by experiments, there are previously obtained a timing of forming the solvent layers 74 periodically, suction rates of the layers 74 at that time, etc., all of which are further stored in the controller 100 in advance.

Note, a series of operations of: discharging the solvent from the nozzle 4A; performing the designated coating process, first sucking the used nozzle 4A; dipping its tip into the solvent reservoir; and secondly sucking the nozzle 4A by the suck-back valve Va, and another series of operations for the next coating process with the use of the nozzle 4B, are carried out on the basis of the process program stored in the controller 100.

As for the periodical formation of the solvent layers 74, a series of operations of: discharging the solvent from the nozzles 4A to 4J; dipping their tips into the solvent reservoirs 61A to 61J; and operating the suck-back valves VA to VJ to suck the nozzles 4A to 4J are executed on a basis of the processing program stored in the controller 100.

Thus, since the periodical formation of the solvent layers 74 at predetermined timings allows the solvent layers 74, whose amounts have been reduced due to evaporation with the passage of time, to be refilled, it is possible to prevent dryness of the processing liquid certainly even when the processing-liquid nozzles 4A to 4J are not used in readiness for a long time.

Figure 11:
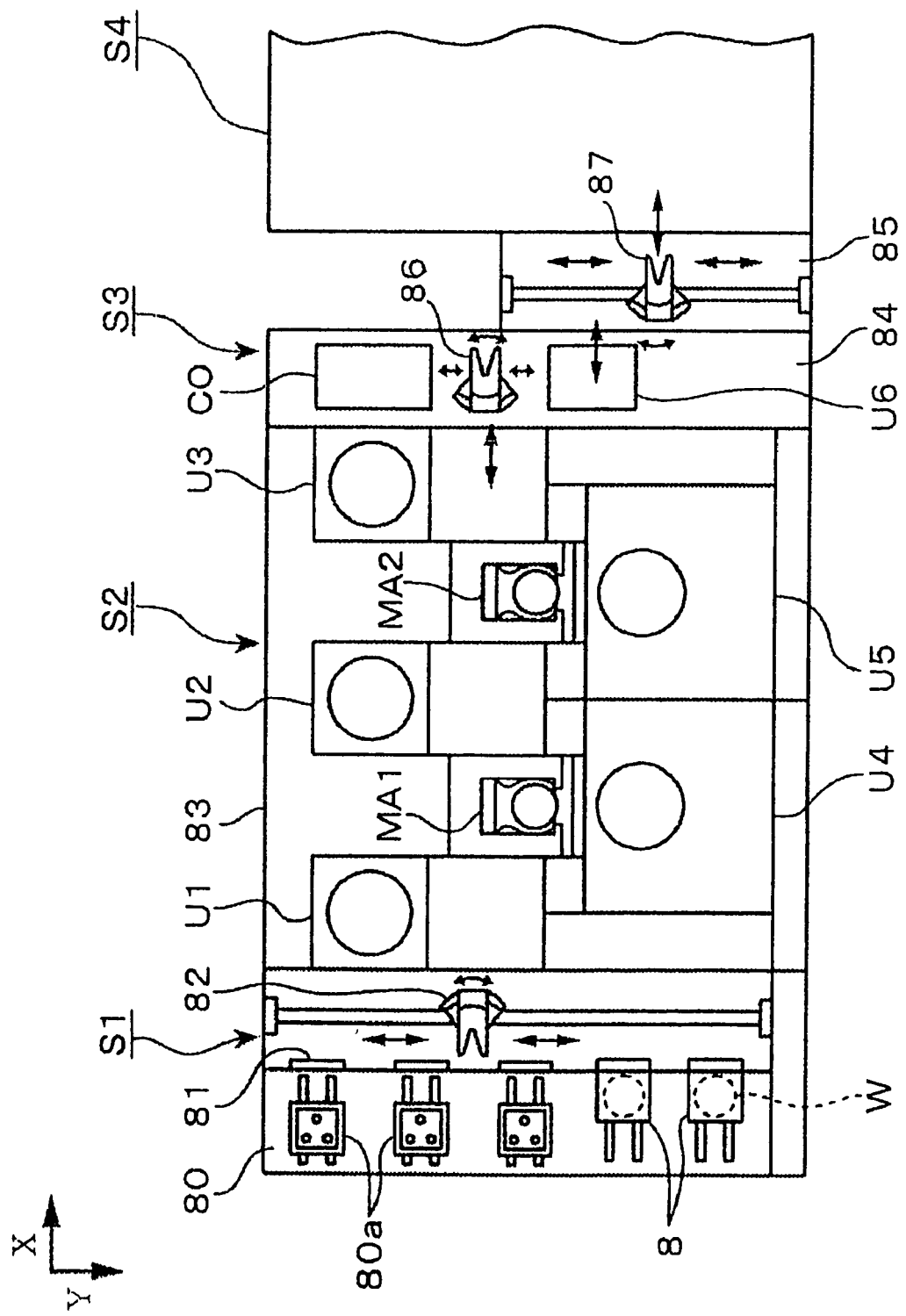

The overall constitution of a resist-pattern forming system where an exposure unit (part) is connected with a coating-and-developing apparatus having the above-mentioned coating apparatus incorporated therein will be described in brief with reference to FIGS. 11 and 12. In these figures, alphabetic signage S1 denotes a carrier mount for loading and unloading a carrier 8 accommodating a plurality of substrates (e.g. thirteen wafers W) in a sealed state. The carrier mount S1 includes a carrier station 80 capable of mounting a plurality of carriers 8 forming a row, drawspans 81 formed in a front wall of the carrier station 80 and a transfer unit 82 for picking up a wafer W from the carrier 8 through the drawspan 81.

Behind the carrier mount S1, a processing section S2 surrounded by a casing 83 is connected to the mount S1 and includes, in order from the near side, shelf units U1, U2 and U3 each having multistage heating/cooling units, liquid-processing units U4 and U5, and main transfer units MA1 and MA2 for transferring a wafer W between the shelf unit U1 (U2, U3) and the liquid-processing unit U4 (U5). The units U1 to U3 and the units MA1, MA2 are arranged one after another so as to form a line back and forth in a view from the carrier mount S1. At respective connection between the shelf unit U1 (U2, U3) and the units MA1 (MA2), not-shown openings for allowing passage of a wafer W are formed so as to allow the wafer W to be moved in the processing section S2 freely, from the shelf unit U1 on one side to the shelf unit U3 on the other side.

Each of the shelf units U1, U2 and U3 is formed by various units for pretreatment/posttreatment of the operations executed at the liquid-processing units U4, U5, laminated in plural stages (e.g. ten stages). In combination, there are contained, in each shelf unit, a delivery unit, a hydrophobic-treatment unit (ADH), a thermo-regulating unit (CPL) for adjusting a wafer W at a predetermined temperature, a baking unit (BAKE) for heating a wafer W before coating resist liquid, a heating unit (PAB) referred to as "pre-baking unit" for heating a wafer W after coating the resist liquid, a heating unit (POST) referred to as "post-baking unit" for heating a wafer W after development, etc.

Figure 12:
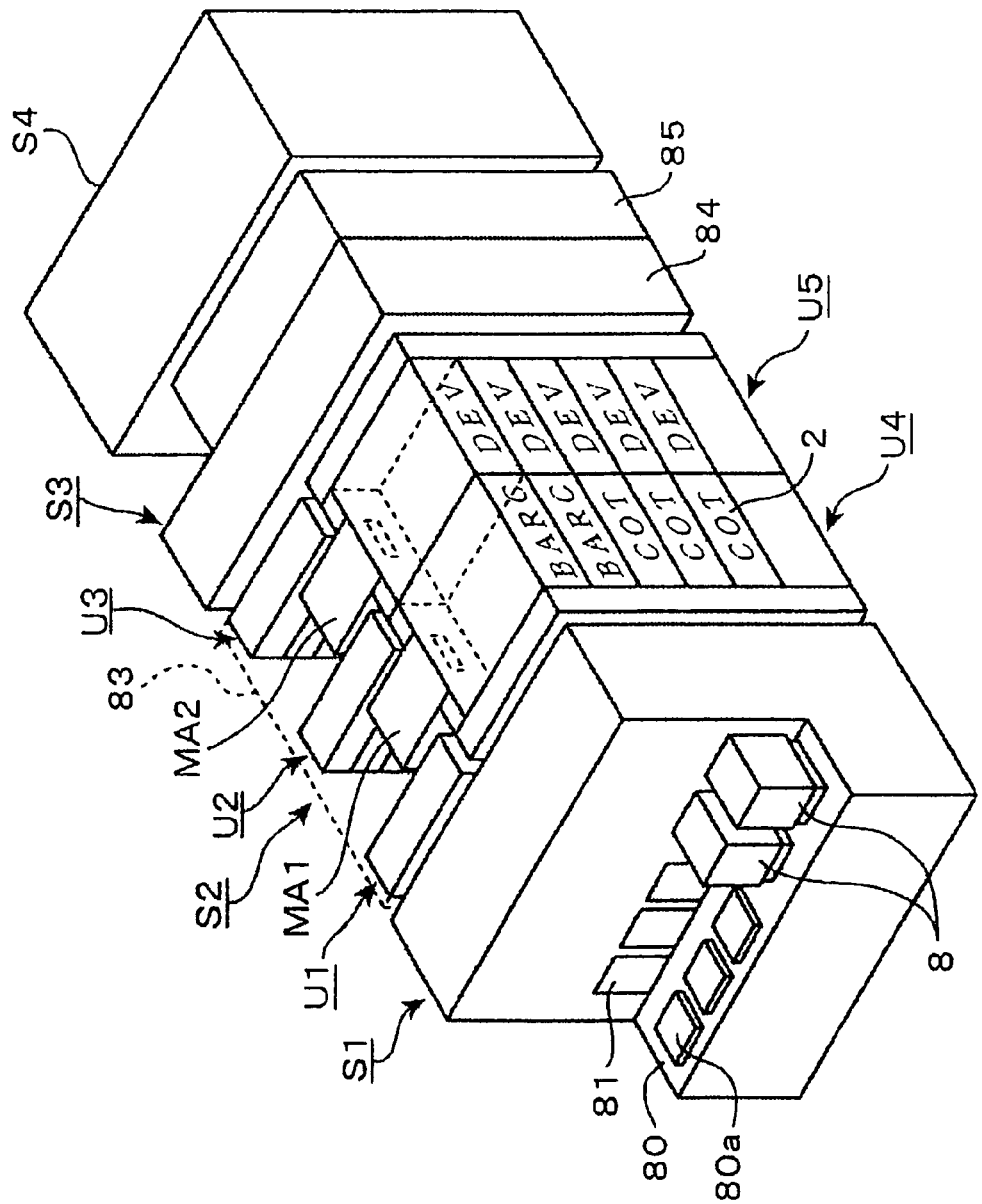
FIG. 12 is a perspective view showing one example of the above resist-pattern formation apparatus.

As shown in FIG. 12, each of the liquid-processing units U4, U5 is formed by an antireflective coating unit (BARC), the coating apparatus (COT) 2 of the invention, a developing unit (DEV) for supplying a wafer W with developing liquid for development, etc. laminated in plural stages, for example, five stages.

Behind the shelf unit U3, an exposure section S4 is connected to the section S2 through an interface section S3. The interface section S3 comprises a first transfer chamber 84 and a second transfer chamber 85 both arranged between the processing section S2 and the exposure section S4. The first transfer chamber 84 and the second transfer chamber 85 include a first transfer arm 86 and a second transfer arm 87, respectively. Both of the arms 86, 87 are constructed so as to be movable up and down, rotatable about a vertical axis and also movable back and forth.

Additionally, the first transfer chamber 84 is provided with a shelf unit U6 in which, for example, a delivery unit, a high-accuracy thermo-regulating unit (CPL), heating/cooling units (PEB) for applying a post-exposure baking on a wafer W, etc. are laminated vertically.

Taking only one case, the flowing of a wafer W in the resist-pattern forming system will be described. For instance, a wafer W mounted on the carrier mount S1 is transferred in the following route of: the thermo-regulating unit (CPL)→the antireflective coating unit (BARC)→the baking unit (BAKE) →the thermo-regulating unit (CPL)→the coating apparatus (COT) 2→the heating unit (PAB)→the exposure section S4. In the exposure section S4, the wafer W is subjected to an exposing process. Then, the wafer W after exposure is transferred in the following route of: the high-accuracy thermo-regulating unit (CPL)→the developing unit (DEV)→the heating unit (POST)→the thermo-regulating unit (CPL) →the carrier 8 of the carrier mount S1.

EXPERIMENTS

Experiments were performed to confirm the effects of the present invention.

Experiment 1

Using the above-mentioned coating apparatus, I-Line resist as the processing liquid and OK73 thinner as the solvent, the experiment 1 was performed wherein an air layer 73 having a thickness of 2 mm and a solvent layer 74 having a thickness of 1.5 to 2 mm were formed in the tip of a processing-liquid nozzle having a bore of 2 mm. While keeping the nozzle unit 4 waiting at the standby position above the standby unit 6, the variation per hour of the solvent layer 74 was estimated visually. Note, the nozzle unit 4 was disposed in an environment of 23° C. in temperature and 45% RH in humidity.

As a result, it was confirmed that the solvent layer 74 began to decrease after one hour has passed since the formation of the layer 74 and that it came to nothing due to evaporation after two hours have passed. Further, It was found that it was necessary to form (refill) a new solvent layer 74 within an elapse time from 1.5 to 2 hr. since the first formation of the solvent layer 74 in order to attain the solvent layer 74 having the above thickness or so.

Experiment 2

Using the above-mentioned coating apparatus, I-Line resist as the processing liquid and OK73 thinner as the solvent, the experiment 2 was performed wherein an air layer 73 having a thickness of 2 mm and a solvent layer 74 having a thickness of 1.5 to 2 mm were formed in the tip of a processing-liquid nozzle having a bore of 2 mm. In this state, the coating process of the processing liquid was successively applied to four wafers W each having a diameter of 200. Subsequently, the in-plane uniformity about the film thicknesses on each wafer W was estimated by measuring film thicknesses on the wafer W at forty-nine points.

Figure 13A:
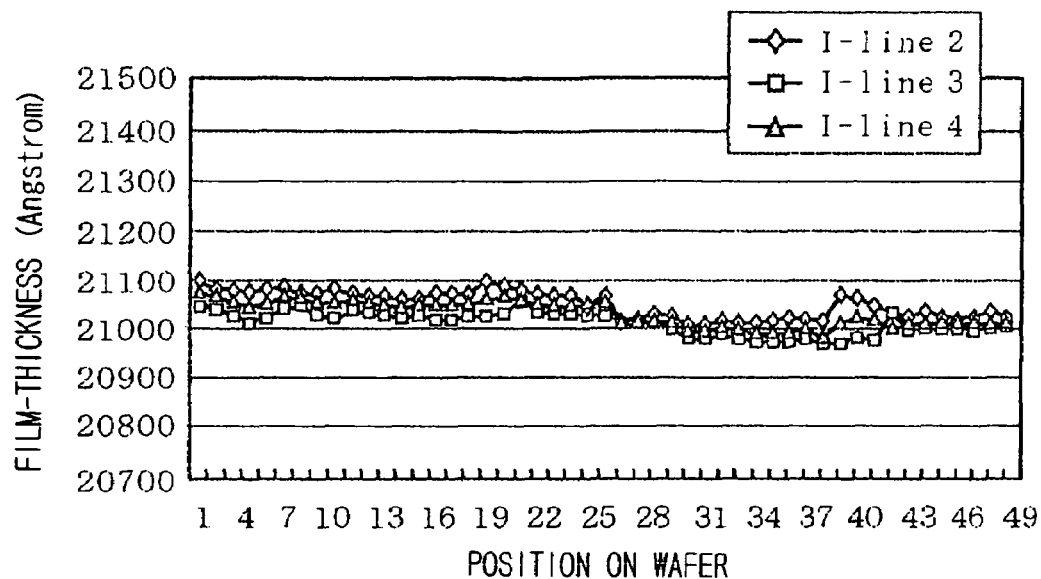
FIGS. 13A and 13B are characteristic diagrams showing the in-plane uniformity of film thickness on a wafer in view of confirming an effect of the invention.
Figure 13B:
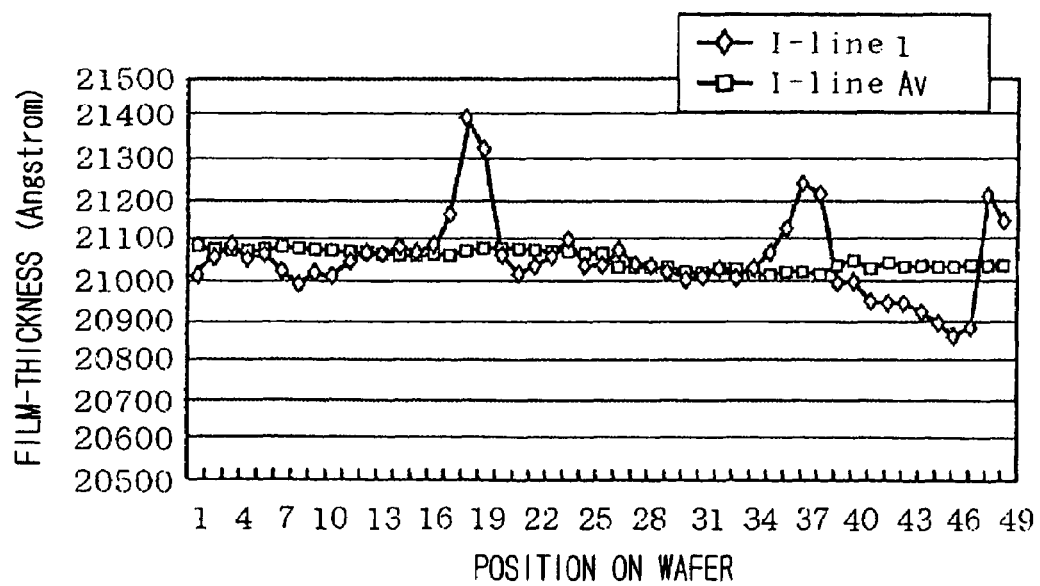

The result is shown in FIG. 13A for the second to fourth wafers W and FIG. 13B for the first wafer W. In common with FIGS. 13A and 13B, a horizontal axis denotes respective positions on a wafer W, which are formed by forty-nine points on a spiral line extending from the wafer's center (pt. 1)

toward the periphery. It should be noted that great numbered points designate respective position in the vicinity of the wafer's periphery. In FIG. 13A, mark ◇ (I-Line 2) designates the second wafer in the coating process, mark Δ (I-Line 3) the third wafer, and mark □ (I-Line 4) designates the fourth wafer in the coating process. In FIG. 13B, mark ◇ (I-Line 1) designates the first wafer in the coating process, and mark □ (I-Line av.) designates an average value of data about the second to fourth wafers.

Here, the solvent layer 74 together with the processing liquid were ejected to the first wafer W, while only the processing liquid was ejected to the second to fourth wafers W. As a result, it was confirmed that the second to fourth wafers W were provided with similar profiles and that degeneration in the processing liquid was suppressed due to the absence of coating defectiveness. While, as for the first wafer W, it was confirmed that its profile was different from those of the second to fourth wafers and that coating defectiveness is produced under the influence of a mixing of the solvent layer 74. In conclusion, it was recognized that high in-plane uniformity could be accomplished by performing a coating process after discharging the solvent layer 74. However, it was also confirmed that the film thicknesses of the first to fourth wafers W were within an allowable range about in-plane uniformity and that the coating defectiveness would be less severe even if the solvent layer 74 were mixed into the coating.

Experiment 3

Using KrF resist as the processing liquid and OK73 thinner as the solvent, the experiment 3 was performed as similar to the experiment 2. The result is shown in FIG. 14A for the second to fourth wafers W and FIG. 14B for the first wafer W. In FIG. 14A, mark ◇ (KrF2) designates the second wafer in the coating process, mark □ (KrF3) the third wafer, and mark Δ (KrF4) designates the fourth wafer in the coating process. In FIG. 14B, mark ◇ (KrF1) designates the first wafer in the coating process, and mark □ (KrF-av.) designates an average value of data about the second to fourth wafers.

As a result, it was confirmed that the second to fourth wafers W were provided with similar profiles, while the profile of the first wafer W was different from those of the second to fourth wafers. Nevertheless, it was also confirmed that the film thicknesses of the coating films on the first to fourth wafers W were together within an allowable range about in-plane uniformity, producing no coating defectiveness.

Experiment 4

Using ArF resist as the processing liquid and OK73 thinner as the solvent, the experiment 4 was performed as similar to the experiment 2. The result is shown in FIG. 15A for the second to fourth wafers W and FIG. 15B for the first wafer W. In FIG. 15A, mark ◇ (ArF2) designates the second wafer in the coating process, mark □ (ArF3) the third wafer, and mark Δ (ArF4) designates the fourth wafer in the coating process. In FIG. 15B, mark ◇ (ArF1) designates the first wafer in the coating process, and mark □ (ArF-av.) designates an average value of data about the second to fourth wafers.

As a result, it was confirmed that the second to fourth wafers W were provided with similar profiles, while the profile of the first wafer W was different from those of the second to fourth wafers, as similar to the Experiment 2. Nevertheless, it was also confirmed that the film thicknesses of the coating films on the first to fourth wafers W were together within an allowable range about in-plane uniformity, producing no coating defectiveness.

According to the present invention, besides the arrangement of the standby unit 6 on the side face of the cup 3, the standby unit 6 may be arranged in a designated position outside the cup 6 appropriately. Similarly, the solvent nozzle 5 may be disposed in any position of the nozzle unit 4, besides the center position in the shown embodiment. Alternatively, the drain part 62 may be arranged in a position so as not to face the solvent nozzle 5 when making the nozzle unit 4 oppose the standby unit 6.

If only arranging the drain part 62 on the straight line L passing through the rotational center O of a wafer W, the part 62 may be provided independently of the solvent reservoirs 61A to 61J. Alternatively, the standby unit 6 may be provided with a plurality of drain parts. Moreover, the nozzle unit 4 may be constructed so as to discharge the solvent layers 74 through a plurality of processing-liquid nozzles simultaneously.

Further, in view of allowing all or some of the processing-liquid nozzles 4A to 4J to dip their tips into the solvent at a time, the solvent reservoirs 61A to 61J may be constructed so as to be usable in common with either all of the nozzles 4A to 4J or some nozzles.

Additionally, the solvent reservoir(s) may be formed so as to allow a two-step suction of solvent, for example, the first suction where part of the processing-liquid nozzles 4A to 4J (e.g. nozzles 4A to 4E) are dipped into the solvent simultaneously and the second suction where the remaining nozzles are dipped into the solvent simultaneously.

Figure 16:
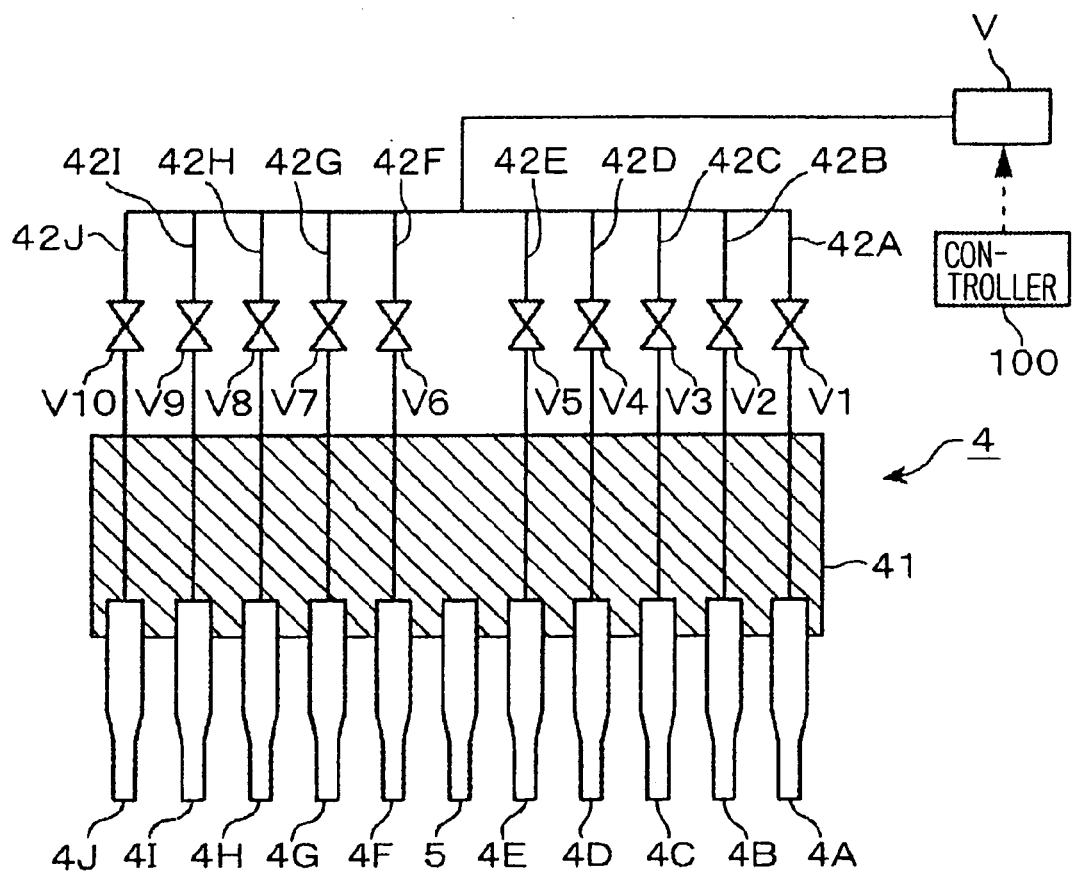
FIG. 16 is a sectional view showing another example of the nozzle unit of the invention.
Figure 17:
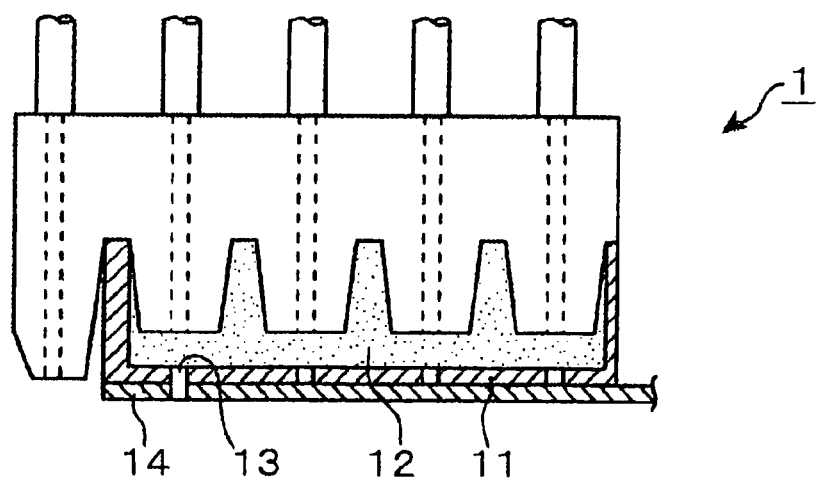
FIG. 17 is a sectional view showing a conventional all-in-one nozzle.

In a modification, the means for sucking the processing-liquid nozzles 4A to 4J may be constructed as shown in FIG. 16. In the shown arrangement, opening and closing valves V1 to V10 are interposed in the processing-liquid supply passages 42A to 42J for the nozzles 4A to 4J, respectively. The processing-liquid supply passages 42A to 42J are connected to a common suck-back valve V. In operation, the controller 100 controls a sucking force in sucking all of the nozzles 4A to 4J and a sucking force in sucking one nozzle 4A appropriately. When performing to suck all of the nozzles 4A to 4J, all of the valves V1 to V10 are opened by the controller 100. While, when performing to suck the single nozzle 4A, the relevant valve V1 is opened by the controller 100. In this way, the suck-back operation may be modified fitly. Note, the processing-liquid sources 43A to 43J are connected to the downstream side of the valves V1 to V10 through the flow control units CA to CJ, respectively.

As a further modification of the invention, when coating a wafer W with the use of the processing-liquid nozzles 4A to 4J, it may be previously carried out to eject a designated amount of processing liquid together with the solvent layer 74. Even in this case, the emissions of the processing liquid could be reduced in comparison with that in the conventional case of discharging the dried processing liquid. Further, in this modification, even if the solvent layer 74 is mixed with the processing-liquid layer 71, it is possible to avoid an occurrence of coating defectiveness.

Besides the coating process of the resist liquid, the present invention is also applicable to the coating process of another processing liquid, such as SOG/SOD. Additionally, besides the semiconductor wafers W, the invention is also applicable to a liquid processing for the other substrates, such as LCD substrates and mask substrates.

The invention claimed is:
1. A liquid processing apparatus comprising;
   a substrate holder for holding a substrate horizontally;
   a nozzle unit in which a plurality of processing-liquid nozzles are provided in a common support integrally, the plurality of processing-liquid nozzles being connected to respective processing-liquid supply passages to each supply the substrate held by the substrate holder with a processing liquid;

a standby unit having a plurality of solvent reservoirs each storing a solvent for the processing liquid, the plurality of solvent reservoirs being arranged to allow tips of the plurality of processing-liquid nozzles of the nozzle unit to dip into the solvent, and a drain part arranged to receive processing liquid discharged from at least one of the plurality of processing-liquid nozzles;

suck means for sucking each processing-liquid nozzle of the nozzle unit; and transfer means for transferring the nozzle unit between a first position over the plurality of solvent reservoirs, a second position over the drain part, and a third position over the substrate to supply the substrate with the processing liquid, wherein the plurality of processing-liquid nozzles of the nozzle unit, and the plurality of solvent reservoirs and the drain part of the standby unit are arranged on a straight center line passing through a rotational center of the substrate.

2. The liquid processing apparatus as claimed in claim 1, wherein:

the nozzle unit further includes a solvent nozzle connected to a solvent supply passage to supply the substrate held by the substrate holder with the solvent, the solvent nozzle being arranged on the straight center line.

3. The liquid processing apparatus as claimed in claim 1, wherein:

the plurality of solvent reservoirs are arranged to allow the tip of each of the plurality of processing-liquid nozzles to dip into the solvent reserved in corresponding one of the plurality of solvent reservoirs.

\* \* \* \* \*